United States Patent
Sugita et al.

(10) Patent No.: US 8,119,324 B2
(45) Date of Patent: Feb. 21, 2012

(54) METHOD OF FORMING PATTERN, COMPOSITION FOR FORMING UPPER-LAYER FILM, AND COMPOSITION FOR FORMING UNDER-LAYER FILM

(75) Inventors: Hikaru Sugita, Tokyo (JP); Nobuji Matsumura, Tokyo (JP); Daisuke Shimizu, Tokyo (JP); Toshiyuki Kai, Tokyo (JP); Tsutomu Shimokawa, Tokyo (JP)

(73) Assignee: JSR Corporation, Tokyo (JP)

( * ) Notice: Subject to any disclaimer, the term of this patent is extended or adjusted under 35 U.S.C. 154(b) by 507 days.

(21) Appl. No.: 12/375,915

(22) PCT Filed: Jul. 27, 2007

(86) PCT No.: PCT/JP2007/064756
§ 371 (c)(1),
(2), (4) Date: Jan. 30, 2009

(87) PCT Pub. No.: WO2008/015969
PCT Pub. Date: Jul. 2, 2008

(65) Prior Publication Data
US 2009/0311622 A1      Dec. 17, 2009

(30) Foreign Application Priority Data
Aug. 4, 2006   (JP) ................................. 2006-213678

(51) Int. Cl.
*G03F 7/00* (2006.01)
*G03F 7/004* (2006.01)
*G03F 7/20* (2006.01)
*G03F 7/26* (2006.01)
*G03F 7/40* (2006.01)

(52) U.S. Cl. ............... 430/270.1; 430/273.1; 430/273.2; 430/312; 430/322; 430/330; 430/331; 430/314; 430/394

(58) Field of Classification Search ............... 430/270.1, 430/273.1, 272.1, 312, 322, 330, 331, 394, 430/396, 314
See application file for complete search history.

(56) References Cited

U.S. PATENT DOCUMENTS
5,278,029 A   1/1994   Shirai et al.
(Continued)

FOREIGN PATENT DOCUMENTS
EP   588544   3/1994
(Continued)

OTHER PUBLICATIONS
Translation of JP 05-150459 (no date).*
(Continued)

*Primary Examiner* — Amanda C. Walke
(74) *Attorney, Agent, or Firm* — Ditthavong Mori & Steiner, P.C.

(57) ABSTRACT

A pattern formation method suitable for forming micro-patterns using electron beams (EB), X-rays, or extreme ultraviolet radiation (EUV) is provided. The method includes the following steps in the following order: (1) a step of forming and curing a under-layer film containing a radiation-sensitive acid generator which generates an acid upon exposure to radiation on a substrate, (2) a step of irradiating the under-layer film with radiation through a mask to cause an acid to be selectively generated in the exposed area of the under-layer film, (3) a step of forming an upper-layer film which does not contain a radiation-sensitive acid generator, but contains a composition capable of polymerization or crosslinking by the action of an acid, (4) a step of forming a cured film by polymerization or crosslinking selectively in the area of the upper-layer film corresponding to the area of the under-layer film in which the acid has been generated, and (5) a step of removing the area of the upper-layer film corresponding to the area of the under-layer film in which the acid has not been generated.

17 Claims, 2 Drawing Sheets

U.S. PATENT DOCUMENTS

| | | | |
|---|---|---|---|
| 6,265,135 | B1 | 7/2001 | Kodama et al. |
| 6,576,400 | B1 | 6/2003 | Tamura |
| 6,730,453 | B2 * | 5/2004 | Nakashima et al. ........ 430/270.1 |
| 6,926,933 | B2 * | 8/2005 | Miyano et al. ................ 427/572 |
| 7,244,549 | B2 * | 7/2007 | Iwasawa et al. .............. 430/326 |
| 7,790,350 | B2 * | 9/2010 | Breyta et al. ............... 430/270.1 |
| 2004/0048200 | A1 | 3/2004 | Ishibashi |
| 2004/0209203 | A1 | 10/2004 | Kano et al. |
| 2008/0096134 | A1 * | 4/2008 | Sugimoto et al. .......... 430/287.1 |
| 2009/0203224 | A1 * | 8/2009 | Shih et al. .................... 438/780 |
| 2010/0233635 | A1 * | 9/2010 | Shimizu et al. ............... 430/325 |

FOREIGN PATENT DOCUMENTS

| | | |
|---|---|---|
| JP | 5-150459 | 6/1993 |
| JP | 6-194842 | 7/1994 |
| JP | 10-104848 | 4/1998 |
| JP | 11-29612 | 2/1999 |
| JP | 2000-147777 | 5/2000 |
| JP | 2000-187330 | 7/2000 |
| JP | 2001-75283 | 3/2001 |
| JP | 2002-72483 | 3/2002 |
| JP | 2002-107920 | 4/2002 |
| JP | 2005-37881 | 2/2005 |

OTHER PUBLICATIONS

Translation of JP 10-104848 (no date).*

Kozawa et al., Relation between spatial resolution and reaction mechanism of chemically amplified resists for electron beam lithography, J. Vac. Sci. Technol. B 21(6), Nov./Dec. 2003, pp. 3149-3152, American Vacuum Society.

Extended European Search Report for corresponding EP Application No. 07791450.5-1226, Nov. 3, 2010.

* cited by examiner

METHOD OF FORMING PATTERN, COMPOSITION FOR FORMING UPPER-LAYER FILM, AND COMPOSITION FOR FORMING UNDER-LAYER FILM

TECHNICAL FIELD

The present invention relates to a method for forming a pattern suitable for microfabrication. More particularly, the present invention relates to a method for forming a pattern suitable for forming micro-patterns using electron beams (EB), X-rays, or extreme ultraviolet radiation (EUV).

BACKGROUND ART

In the field of microfabrication represented by fabrication of IC chips, miniaturization of the design rules is rapidly progressing in order to achieve higher integration of the circuits. Development of a lithographic process enabling microfabrication in a stable manner has been actively pursued. However, since it has been difficult to form micro patterns of less than 45 nm with high precision by a general method of using a KrF or an ArF excimer laser, a method of using EB or EUV has been proposed.

The following various radiation-sensitive resin compositions have been proposed as positive-tone resists for electron beams or extreme ultraviolet radiation used for such ultramicrofabrication.

(1) Chemically-amplified radiation-sensitive resin composition comprising a polyhydroxystyrene resin partially protected by an acid-dissociable functional group (resin for KrF excimer), a novolak (resin for i lines), and an acid-dissociable group:

Various patent applications such as a composition containing a polyhydroxystyrene resin partially protected by an acetal group and an acid generator having well-balanced sensitivity and resolution (see Patent Document 3), a composition containing polyhydroxystyrene resin partially protected by various acid dissociable groups, an onium salt which generates a fluorine-containing aromatic sulfonic acid, and a fluorine-containing or silicon-containing surfactant (see Patent Document 4), an onium salt having at least one electron attractive group (fluorine, a cyano group, a nitro group) as a substituent of a cation moiety (see Patent Document 5), a resin having a disulfonyl group (see Patent Document 6), a resin having N-oxyimidesulfonyl group (see Patent Document 7), and the like have been disclosed. However, these methods still have not reached a practical use level in surface roughness, sensitivity, and resolution during micro-pattern formation.

Micro-pattern formation is said to be difficult when using a chemically amplified resist utilizing an effect of acid diffusion (Nonpatent Document 1).

(2) PMMA (polymethylmethacrylate) main chain cutting-type radiation-sensitive resin composition:

The resin composition exhibits excellent resolution, but can be used in practice only with difficulty due to problems of sensitivity and outgassing. Poly-t-butyl-α-chloromethylstyrene exhibiting excellent balance of resolution and sensitivity (Patent Document 1) and a resin with an atom (N, O, S) which is easily cut by electron beams introduced into the resin terminal (Patent Document 2) have been disclosed. However, although some improvement of sensitivity may be recognized, the resins still have problems in sensitivity, etching resistance, and outgassing. These resins therefore have not yet reached a practical usable level.

Patent Document 1: JP-A-2000-147777
Patent Document 2: JP-A-11-29612
Patent Document 3: JP-A-6-194842
Patent Document 4: JP-A-2000-187330
Patent Document 5: JP-A-2001-075283
Patent Document 6: JP-A-2002-072483
Patent Document 7: JP-A-2002-107920
Nonpatent Document 1: "Relation between spatial resolution and reaction mechanism of chemically amplified resists for electron beam lithography", Journal of Vacuum Science & Technology B (USA), December, 2003, Vol. 21, No. 6, pp. 3149 to 3152

DISCLOSURE OF THE INVENTION

The present invention has been achieved in view of the above problems and has an object of providing a pattern forming method which can form micro patterns having excellent resolution at a high precision. Because the pattern forming method of the present invention includes a step of forming an upper-layer film containing a polymerizable or crosslinkable composition on a under-layer film which is provided with a contrast containing or not containing an acid, reduction of outgassing which causes a problem in general chemically-amplified or non-chemically-amplified resists can be expected.

Another object of the present invention is to provide a pattern forming method suitable for EB, X-rays, or EUV using a resist effectively responding to electron beams and extreme ultraviolet radiation.

According to the present invention, the following pattern forming methods are provided.

[1] A pattern forming method comprising the following steps in the following order: (1) a step of forming and curing a under-layer film containing a radiation-sensitive acid generator which generates an acid upon exposure to radiation on a substrate, (2) a step of irradiating the under-layer film with radiation through a mask to cause an acid to be selectively generated in the exposed area of the under-layer film, (3) a step of forming an upper-layer film which does not contain a radiation-sensitive acid generator, but contains a composition capable of increasing the molecular weight by polymerization or crosslinking by the action of an acid, (4) a step of forming a cured film by polymerization or crosslinking selectively in the area of the upper-layer film corresponding to the area of the under-layer film in which the acid has been generated, and (5) a step of removing the area of the upper-layer film corresponding to the area of the under-layer film in which the acid has not been generated.

[2] A pattern forming method comprising the following steps in the following order: (1) a step of forming and curing a under-layer film containing a radiation-sensitive acid generator which generates an acid upon exposure to radiation on a substrate, (2) a step of irradiating the under-layer film with radiation through a mask to cause an acid to be selectively generated in the exposed area of the under-layer film, (3) a step of exposing the under-layer film to a gas which does not contain a radiation-sensitive acid generator, but contains a monomer capable of increasing the molecular weight by polymerization or crosslinking by the action of an acid, and (4) a step of forming a cured film by polymerization of the monomer or crosslinking selectively in the area of the under-layer film in which the acid has been generated.

[3] A pattern forming method comprising the following steps in the following order: (1) a step of forming and curing a under-layer film containing a radiation-sensitive acid generator which generates an acid upon exposure to radiation on a substrate, (2) a step of forming an upper-layer film which does not contain a radiation-sensitive acid generator, but contains a composition capable of increasing the molecular weight by polymerization or crosslinking by the action of an acid, and forming a laminate from the under-layer film and the upper-layer film, (3) a step of irradiating the laminate with radiation through a mask to generate an acid selectively in the irradiated area of the under-layer film, (4) a step of forming a cured film by polymerization or crosslinking selectively in the area of the upper-layer film corresponding to the area of the under-layer film in which the acid has been generated, and (5) a step of removing the area of the upper-layer film corresponding to the area of the under-layer film in which the acid has not been generated.

[4] The pattern forming method according to any one of [1] to [3], wherein the under-layer film is an organic film containing a radiation-sensitive acid generator.

[5] The pattern forming method according to any one of [1] to [3], wherein the under-layer film contains a hydrolyzate or a condensate, or both, of at least one compound selected from the group consisting of compounds shown by the following formula (1) and (2),

wherein $R^1$ represents a hydrogen atom or a monovalent organic group, $R^2$ represents a hydrogen atom or a monovalent organic group, and a represents an integer from 0 to 2,

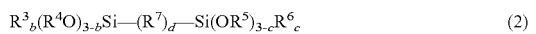

wherein $R^3$, $R^4$, $R^5$, and $R^6$ the same or different, individually represent a monovalent organic group or a hydrogen atom, b and c individually represent an integer from 0 to 2, $R^7$ represents an oxygen atom or a group $-(CH_2)_n-$, (wherein n represents an integer from 1 to 6), and d represents 0 or 1.

[6] The pattern forming method according to [1] or [3], wherein the upper-layer film contains a hydrolyzate or a condensate, or both, of a compound shown by the following formula (1),

wherein $R^1$ represents a hydrogen atom, an alkyl group having 1 to 10 carbon atoms, or an aryl group, $R^2$ represents a hydrogen atom or a monovalent organic group, and a represents an integer from 0 to 2.

[7] The pattern forming method according to [1] or [3], wherein the upper-layer film contains an organic compound, excluding at least one of the hydrolyzate or condensate of the compound shown by the following formula (1), of which the molecular weight increases by polymerization or crosslinking by the action of an acid.

wherein $R^1$ represents a hydrogen atom, an alkyl group having 1 to 10 carbon atoms, or an aryl group, $R^2$ represents a hydrogen atom or a monovalent organic group, and a represents an integer from 0 to 2.

[8] The pattern forming method according to [7], wherein the upper-layer film contains a polymer having at least one repeating unit shown by the following formulas (3), (4A), and (4B) and has a polystyrene-reduced weight average molecu lar weight measured by a gel-permeation chromatography method of 500 to 500,000,

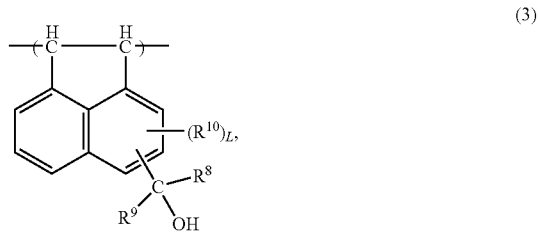

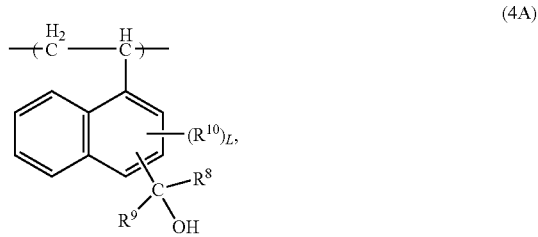

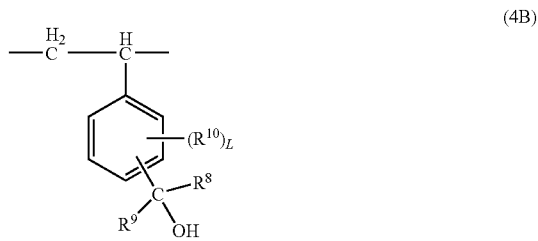

wherein $R^8$ and $R^9$ show a hydrogen atom, an alkyl group having 1 to 3 carbon atoms, or an aryl group, $R^{10}$ represents an alkyl group having 1 to 3 carbon atoms, a vinyl group, an allyl group, or an aryl group, and L is 0, 1, or 2.

[9] The pattern forming method according to [7], wherein the upper-layer film contains a polymer having a repeating unit selected from the repeating unit shown by the following formula (5) and a polystyrene-reduced weight average molecular weight measured by a gel-permeation chromatography method of 500 to 500,000,

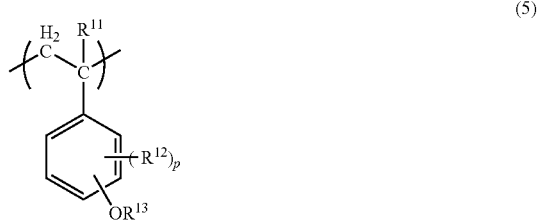

wherein $R^{11}$ and $R^{12}$ represent a hydrogen atom, an alkyl group having 1 to 3 carbon atoms, or an aryl group, $R^{13}$ represents a hydrogen atom, an alkyl group having 1 to 10 carbon atoms, a vinyl group, an allyl group, or an aryl group, and p is 0, 1, or 2.

[10] The pattern forming method according to [7], wherein the upper-layer film contains a polymer having a repeating unit selected from the repeating unit shown by the following formula (6) and a polystyrene-reduced weight average molecular weight measured by a gel-permeation chromatography method of 500 to 500,000,

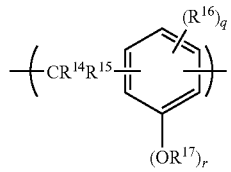
(6)

wherein $R^{14}$ and $R^{15}$ show a hydrogen atom, an alkyl group having 1 to 3 carbon atoms, or an aryl group, $R^{16}$ represents an alkyl group having 1 to 10 carbon atoms, a vinyl group, an allyl group, or an aryl group, $R^{17}$ represents a hydrogen atom, an alkyl group having 1 to 10 carbon atoms, or an aryl group, q is 0, 1, or 2, and r is 1, 2, or 3.

[11] The pattern forming method according to [7], wherein the composition of which the molecular weight has increased as a result of polymerization of the upper-layer film contains a repeating unit selected from the repeating unit shown by the following formula (7) and has a polystyrene-reduced weight average molecular weight measured by a gel-permeation chromatography method of 500 to 500,000,

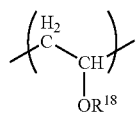
(7)

wherein $R^{18}$ represents a hydrogen atom, an alkyl group having 1 to 10 carbon atoms, or an aryl group.

[12] The pattern forming method according to [2], wherein the composition of which the molecular weight has increased as a result of polymerization of the monomer contains a repeating unit selected from the repeating unit shown by the following formula (7) and has a polystyrene-reduced weight average molecular weight measured by a gel-permeation chromatography method of 500 to 500,000,

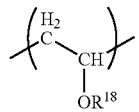
(7)

wherein $R^{18}$ represents a hydrogen atom, an alkyl group having 1 to 10 carbon atoms, or an aryl group.

[13] A composition for forming an upper-layer film used in the pattern forming method according to any one of [1] to [12].

[14] A composition for forming a under-layer film used in the pattern forming method according to any one of [1] to [12].

The pattern forming method of the present invention can form micro patterns at a high precision and in a stable manner when a pattern is formed using EB, X-rays, or EUV.

EXPLANATION OF SYMBOLS

Figure 1A:
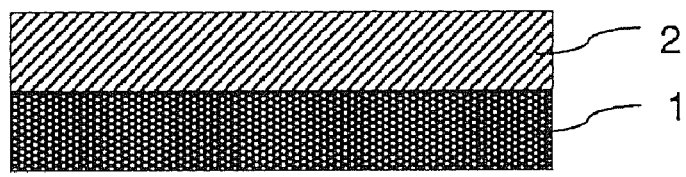
FIG. 1 is a process flowchart of one embodiment of the pattern forming method of the present invention.
Figure 1B:
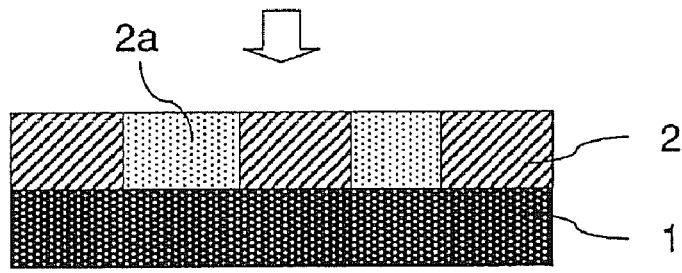

1 Silicon wafer
2 Under-layer film
2a Under-layer film portion containing acid generated by irradiation
3 Upper-layer film for patterning
3a Upper-layer film for patterning in which crosslinking reaction has proceeded by the action of acid in under-layer film

BEST MODE FOR CARRYING OUT THE INVENTION

The pattern forming method of the present invention will now be described with reference to FIGS. 1 and 2. FIGS. 1 and 2 are flowcharts showing the pattern forming method. Note that the present invention is not limited to the following embodiments, and various modifications and improvements of the design may be appropriately made without departing from the scope of the present invention based on knowledge of a person having ordinary skill in the art.

[Explanation of FIG. 1]

(1) Step of Forming and Curing a Under-Layer Film on a Substrate to be Processed A resin composition solution for forming a under-layer film containing an organic polymer, such as polyhydroxystyrene or a siloxane sol obtained by hydrolysis condensation of tetramethoxysilane and/or methyltrimethoxysilane, and triphenylsulfonium triflate as a photoacid generator are spin-coated on a silicon wafer 1 with a diameter of 8 inches. The coating is prebaked on a hot plate at 200 to 300° C. for 30 to 120 seconds to obtain a cured under-layer film 2 with a thickness of 80 nm (FIG. 1(a)). The under-layer film may be formed on an organic antireflection film after forming an oxide layer, a conductive layer, the organic antireflection film, and the like on the silicon wafer 1. In this instance, the organic antireflection film may be formed by spin-coating a composition for forming the organic antireflection film on the silicon wafer 1 and heating the coating on a hot plate at 200 to 300° C. for 60 to 120 seconds. The antireflection film should have a thickness which minimizes the rate of reflection from the substrate. The thickness differs according to the product and is generally 200 to 500 nm.

(2) Step of Irradiating Under-Layer Film with Radiation to Partly Generate Acid

The silicon wafer 1 on which the under-layer film 2 has been formed is exposed to radiation through a mask pattern for an optimum irradiation time using an electron beam drawing apparatus manufactured by Hitachi, Ltd. (2a in FIG. 1(b) indicates a film containing the acid generated by irradiation).

(3) Step of Patterning the Upper-Layer Film

Figure 1C:
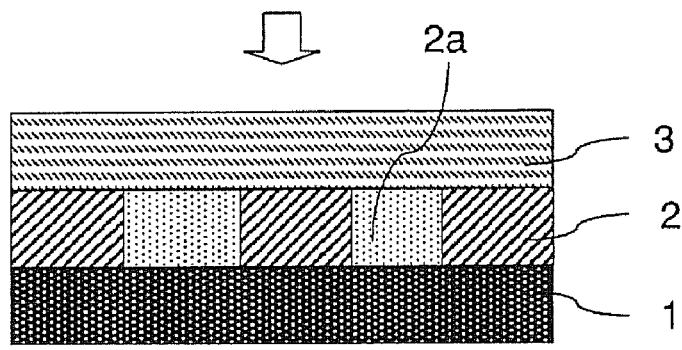
Figure 1D:
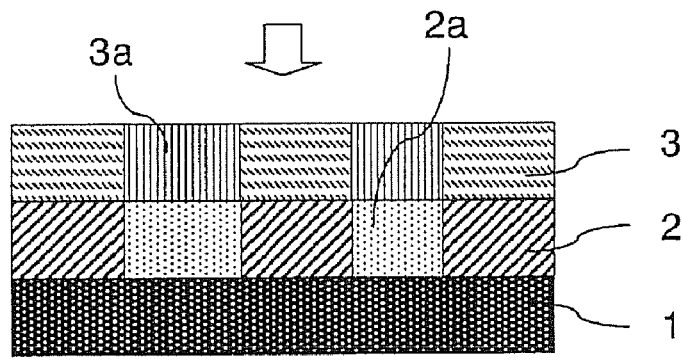
Figure 1E:
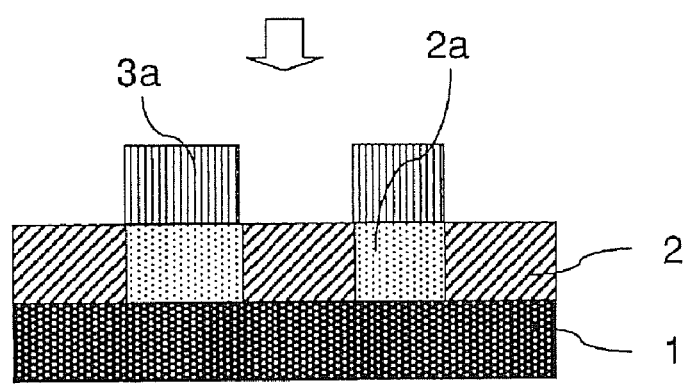
Figure 2A:
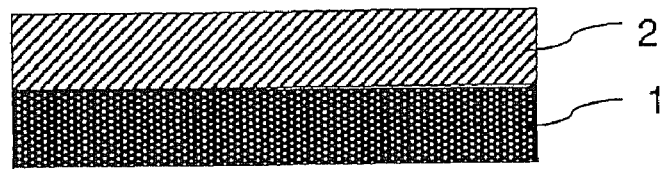
FIG. 2 is a process flowchart of another embodiment of the pattern forming method of the present invention.
Figure 2B:
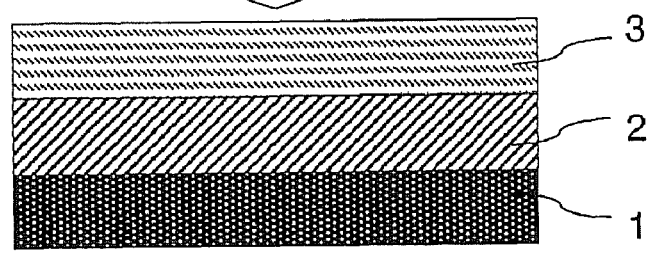
Figure 2C:
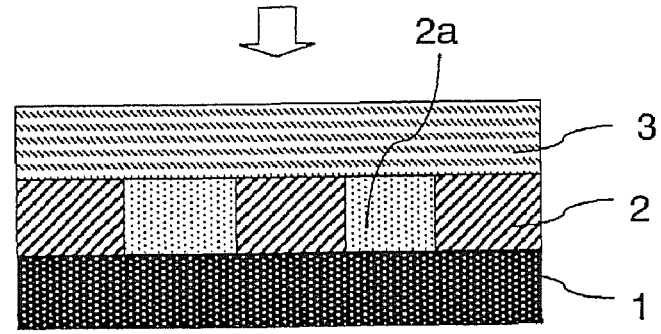
Figure 2D:
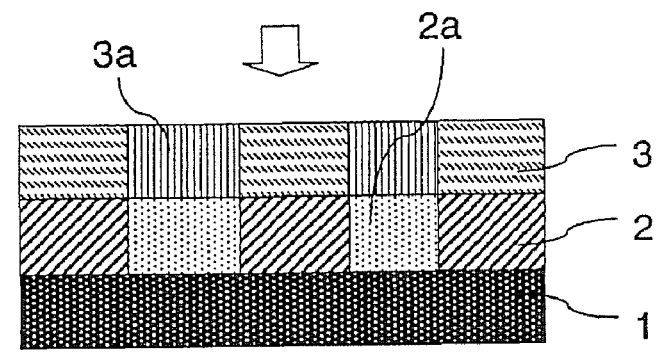
Figure 2E:
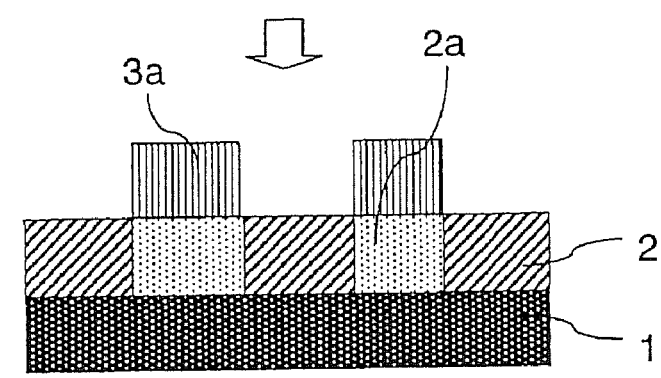

After applying an upper-layer film 3 for patterning which turns into a negative-tone in the presence of an acid on the under-layer film in which 2 and 2a are present together, the resist film is postbaked on a hot plate at 100 to 200° C. for 60 to 120 seconds, developed using a 2.38 mass % tetramethylammonium hydroxide aqueous solution at 25° C. for 30 to 120 seconds, washed with water, and dried to form an upper-layer pattern 3a (FIGS. 1(c) to 1(e)). Instead of applying the upper-layer film 3 for patterning, the under-layer film may be exposed to a monomer gas with high volatility. In this instance, the above step of development is unnecessary.

[Explanation of FIG. 2]

(1) Step of Forming and Curing a Under-Layer Film on a Substrate to be Processed A resin composition solution for forming a under-layer film containing an organic polymer, such as polyhydroxystyrene or a siloxane sol obtained by hydrolysis condensation of tetramethoxysilane and/or methyltrimethoxysilane, and triphenylsulfonium triflate as photoacid generator are spin-coated on a silicon wafer with a diameter of 8 inches. The coating is prebaked on a hot plate at 200 to 300° C. for 30 to 120 seconds to obtain a cured under-layer film 2 with a thickness of 80 nm (FIG. 2(*a*)). Alternatively, the under-layer film 2 may be formed on an organic reflection preventing film after forming an oxide layer, a conductive layer, the organic reflection-preventing film, and the like on the silicon wafer 1. In this instance, the organic reflection preventing film may be formed by spin-coating a composition for forming the organic reflection preventing film on the silicon wafer 1 and heating the coating on a hot plate at 200 to 300° C. for 60 to 120 seconds. The antireflection film should have a thickness which minimizes the rate of reflection from the substrate. The thickness differs according to the product and is generally 200 to 500 nm.

(2) Step of Forming Upper-Layer Film for Patterning on Under-Layer Film

After applying an upper-layer film 3 for patterning which turns into a negative-tone in the presence of an acid on the under-layer film 2, the film is prebaked on a hot plate at 100 to 200° C. for 60 to 120 seconds (FIG. 2(*b*)).

(3) Step of Irradiating Under-Layer Film with Radiation to Partly Generate Acid

The silicon wafer 1 on which the under-layer film 2 and the upper-layer film 3 have been formed is exposed to radiation through a mask pattern for an optimum irradiation time using an electron beam drawing apparatus manufactured by Hitachi, Ltd. (2*a* in FIG. 2(*c*) indicates a film containing the acid generated by irradiation).

(4) Step of Patterning the Upper-Layer Film

After post-baking the silicon wafer 1 on which a under-layer film and an upper-layer film 3 are formed on a hot plate at 100 to 200° C. for 60 to 120 seconds, the resist is developed using a 2.38 mass % tetramethylammonium hydroxide aqueous solution at 25° C. for 30 to 120 seconds, washed with water, and dried to form an upper-layer pattern 3*a* (FIGS. 2(*d*) and 2(*e*)).

As organic polymer resins used for the under-layer film, polyacenaphthylenes and the like may be given in addition to polyhydroxystyrenes, phenol-type novolaks, and naphtol-type novolaks.

As examples of the composition used for the pattern forming method, in addition to organic polymers such as polyhydroxystyrene, a hydrolyzate or a condensate of at least one compound selected from the group consisting of compounds shown by the following formula (1) or (2) can be given. Specifically, a hydrolyzate of at least one compound selected from the group consisting of the compounds shown by the following formula (1), a condensate of at least one compound selected from the group consisting of the compounds shown by the following formula (1), a hydrolyzate of at least one compound selected from the group consisting of the compounds shown by the following formula (2), a condensate of at least one compound selected from the group consisting of the compounds shown by the following formula (2) can be given.

(1)

wherein $R^1$ represents a hydrogen atom or a monovalent organic group, $R^2$ represents a hydrogen atom or a monovalent organic group, and a represents an integer from 0 to 2.

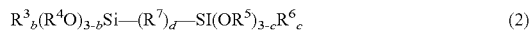

(2)

wherein $R^3$, $R^4$, $R^5$, and $R^6$ the same or different, individually represent a monovalent organic group or a hydrogen atom, b and c the same or different, represent an integer from 0 to 2, $R^7$ represents an oxygen atom or a group —$(CH_2)_n$—, (wherein n represents an integer from 1 to 6), and d represents 0 or 1.

As examples of the monovalent organic group represented by $R^1$ and $R^2$ in the formula (1), a substituted or unsubstituted alkyl group, aryl group, allyl group, glycidyl group, and the like may be given. $R^1$ in the formula (1) is preferably a monovalent organic group, and particularly preferably an alkyl group or a phenyl group.

As examples of the alkyl group, a methyl group, an ethyl group, a propyl group, a butyl group, and the like can be given. The alkyl group preferably has 1 to 5 carbon atoms. These alkyl groups may be either linear or branched, in which a hydrogen atom may be replaced with a fluorine atom or the like.

As examples of the aryl group in the formula (1), a phenyl group, a naphthyl group, a methylphenyl group, an ethylphenyl group, a chlorophenyl group, a bromophenyl group, a fluorophenyl group, and the like can be given.

As specific examples of the compound shown by the formula (1), trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluoro-tri-n-propoxysilane, fluorotri-iso-propoxysilane, fluorotri-n-butoxysilane, fluorotri-sec-butoxysilane, fluorotri-tert-butoxysilane, fluorotriphenoxysilane,
tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane; methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltrimethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-sec-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldi-phenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldi-phenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldi-phenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldi-ethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, divinyltrimethoxysilane, di-γ-aminopropyldimethoxysilane, di-γ-aminopropyldiethoxysilane, di-γ-glycidoxypropyldimethoxysilane, di-γ-glycidoxypropyldiethoxysilane, di-γ-trifluoropropyldimethoxysilane, di-γ-trifluoropropyldiethoxysilane, and the like can be given.

Among these, tetramethoxysilane, tetraethoxysilane, tetra-n-propoxysilane, tetra-iso-propoxysilane, tetraphenoxysilane, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, i-propyltrimethoxysilane, i-propyltriethoxysilane, n-butyltrimethoxysilane, n-butyltriethoxysilane, i-butyltrimethoxysilane, i-butyltriethoxysilane, tert-butyltrimethoxysilane, tert-butyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane are preferable.

These compounds may be used either individually or in combination of two or more.

As examples of the monovalent organic groups in the formula (2), the same organic groups given as examples for the formula (1) can be given.

Examples of the compound in which $R^7$ is an oxygen atom in the formula (2) include hexamethoxydisiloxane, hexaethoxydisiloxlane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy1,1,3,3-tetraphenyldisiloxane.

Among these, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane are preferable.

As specific examples of the compound in which d is 0 in the formula (2), hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethyoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane can be given.

Examples of the compound in which $R^7$ is —$(CH_2)_n$— in the formula (2) include bis(hexamethoxysilyl)methane, bis(hexaethoxysilyl)methane, bis(hexaphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl)ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(hexamethoxysilyl)propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane. Among these, hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(hexamethoxysilyl)methane, bis(hexaethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, and bis(ethoxydiphenylsilyl)methane are preferable.

As the composition for the under-layer film in the present invention, the compound of the formula (1) and the compound of the formula (2), or either the compound of the formula (1) or the compound of the formula (2) may be used. Two or more compounds selected from the compound of the formula (1) or the compound of the formula (2) may be used.

In order to ensure excellent adhesion to the upper-layer film for patterning, the composition for the under-layer film is preferably either the following (a) or (b), particularly (b).

(a) A hydrolyzate and a condensate, or either the hydrolyzate or condensate, of the compound shown by the following formula (8),

$$Si(OR^2)_4 \qquad (8)$$

wherein $R^2$ shows a monovalent organic group, of which specific examples are the same as in the formula (1).

(b) A hydrolyzate and a condensate, or either the hydrolyzate or the condensate, of silane compounds which include the compound shown by the formula (8) and the compound shown by the following formula (9),

$$R^1_s Si(OR^2)_{4-s} \qquad (9)$$

wherein $R^1$ and $R^2$ the same or different, individually show a monovalent organic group, of which the specific examples are the same as those in the formula (1) and s is 1 or 2.

In the case of the above (b), the amount of the compound shown by the formula (9) (as complete hydrolysis condensate) is preferably 0.5 to 30 parts by weight, and more preferably 0.5 to 25 parts by weight for 100 parts by weight of the compounds shown by the formulas (8) (as complete hydrolysis condensate).

When hydrolyzing or partially condensing the compound shown by the formula (1) or (2), water is used in an amount preferably 0.25 to 3 mol, and more preferably 0.3 to 2.5 mol per one mol of the group shown by $R^2O$—, $R^4O$—, or $R^5O$—. If the amount of water used is in the range from 0.3 to 2.5 mol, there is only a small possibility of decrease in homogeneity of the coated film and storage stability of the composition for forming the under-layer film for resist.

Specifically, water is intermittently or continuously added to an organic solvent in which the compound shown by the formula (1) or (2) is dissolved. The catalyst may be previously added to the organic solvent or may be dissolved or dispersed in water during the addition of water. The reaction temperature is usually 0 to 100° C., and preferably 15 to 80° C. The composition for forming the under-layer film for the resist of the present invention may be obtained by adding an organic solvent to the reaction Solution.

When two or more compounds shown by the formula (1) or the formula (2) are used in combination, (a) the two or more compounds may be hydrolyzed or condensed after mixing or (b) the two or more compounds shown by the formula (1) or (2) may be separately hydrolyzed or condensed and mixed thereafter. The method (b) is preferred.

A catalyst may be used when hydrolyzing or partially condensing the compound shown by the formula (1) or (2). A metal chelate compound, an organic acid, an inorganic acid, an organic base, and an inorganic base can be given as examples of the catalyst.

The following compounds can be given as examples of the metal chelating compound: titanium chelate compounds such as triethoxy.mono(acetylacetonate)titanium, tri-n-propoxy.mono(acetylacetonate)titanium, tri-i-propoxy.mono(acetylacetonate)titanium, tri-n-butoxy.mono(acetylacetonate)titanium, tri-sec-butoxy.mono(acetylacetonate)titanium, tri-t-butoxy.mono(acetylacetonate)titanium, diethoxy.bis(acetylacetonate)titanium, di-n-propoxy.bis(acetylacetonate)titanium, di-i-propoxy.bis(acetylacetonate)titanium, di-n-butoxy.bis(acetylacetonate)titanium, di-sec-butoxy.bis(acetylacetonate)titanium, di-t-butoxy.bis(acetylacetonate)titanium, monoethoxy.tris(acetylacetonate)titanium, mono-n-propoxy.tris(acetylacetonate)titanium, mono-i-propoxy.tris(acetylacetonate)titanium, mono-n-butoxy.tris(acetylacetonate)titanium, mono-sec-butoxy.tris(acetylacetonate)titanium, mono-t-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxytris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium;

zirconium chelate compounds such as triethoxy-mono(acetylacetonate)zirconium, tri-n-propoxy.mono(acetylacetonate)zirconium, tri-i-propoxy.mono(acetylacetonate)zirconium, tri-n-butoxy.mono(acetylacetonate)zirconium, tri-sec-butoxy.mono(acetylacetonate)zirconium, tri-t-butoxy.mono(acetylacetonate)zirconium, diethoxy.bis(acetylacetonate)zirconium, di-n-propoxy.bis(acetylacetonate)zirconium, di-i-propoxy.bis(acetylacetonate)zirconium, di-n-butoxy.bis(acetylacetonate)zirconium, di-sec-butoxy.bis(acetylacetonate)zirconium, di-t-butoxy.bis(acetylacetonate)zirconium, monoethoxy.tris(acetylacetonate)zirconium, mono-n-propoxy.tris(acetylacetonate)zirconium, mono-i-propoxy.tris(acetylacetonate)zirconium, mono-n-butoxy.tris(acetylacetonate)zirconium, mono-sec-butoxy.tris(acetylacetonate)zirconium, mono-t-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, (ethylacetoacetate)zirconium, mono-i-propoxy.tris (ethylacetoacetate)zirconium, mono-n-butoxy.tris (ethylacetoacetate)zirconium, mono-sec-butoxy.tris (ethylacetoacetate)zirconium, mono-t-butoxy.tris (ethylacetoacetate)zirconium, tetrakis(ethylacetoacetate) zirconium, mono(acetylacetonate).tris(ethylacetoacetate) zirconium, bis(acetylacetonate).bis(ethylacetoacetate) zirconium, and tris(acetylacetonate).mono (ethylacetoacetate)zirconium; and aluminum chelate compounds such as tris(acetylacetonate)aluminum and tris(ethylacetacetate)aluminum.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and the like.

As examples of the inorganic acids, hydrochloric acid, nitric acid, sulfuric acid, hydrofluoric acid, and phosphoric acid can be given.

As examples of the organic base, pyridine, pyrrole, piperazine, pyrrolidine, piperidine, picoline, trimethylamine, triethylamine, monoethanolamine, diethanolamine, dimethyl monoethanolamine, monomethyldiethanolamine, triethanolamine, diazabicyclo octane, diazabicyclo nonane, diazabicyclo undecene, tetramethyl ammonium hydroxide, and the like can be given.

As examples of the inorganic base, ammonia, sodium hydroxide, potassium hydroxide, barium hydroxide, calcium hydroxide, and the like can be given.

Among these catalysts, a metal chelate compound, an organic acid, and an inorganic acid are preferable, and a titanium chelate compound and an organic acid are more preferable. These catalysts may be used either individually or in combination of two or more.

The amount of the catalyst used is usually 0.001 to 10 parts by weight, and preferably 0.01 to 10 parts by weight for 100 parts by weight of the compound (as complete hydrolysis condensate) obtained from the compound of the formula (1).

[Acid Generator]

A latency photoacid generator can be given as acid generator used in the present invention.

The latent acid generator used in the present invention is a compound generating an acid by being irradiated with ultraviolet rays with energy of usually 1 to 100 mJ, and preferably 10 to 50 mJ.

Examples of the photoacid generator include onium salt photoacid generators such as diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-t-butylphenyl)iodonium trifluoromethanesulfonate, bis(4-t-butylphenyl)iodonium dodecylbenzenesulfonate, bis(4-t-butylphenyl) iodonium naphthalenesulfonate, bis(4-t-butylphenyl) iodonium hexafluoroantimonate, bis(4-t-butylphenyl) iodonium nonafluoro-n-butanesulfonate, triphenylsulfonium trifluorometane sulfonate, triphenylsulfonium hexafluoroantimonate, triphenylsulfonium naphthalenesulfonate, triphenylsulfonium nonafluoro-n-butanesulfonate, diphenyl(4-methylphenyl)sulfonium trifluoromethanesulfonate, diphenyl(4-methoxyphenyl)sulfonium trifluoromethanesulfonate, (hydroxyphenyl)benzenemethylsulfonium toluenesulfonate, cyclohexylmethyl(2-oxocyclohexyl)sulfonium trifluoromethanesulfonate, dicyclohexyl(2-oxocyclohexyl) sulfonium trifluoromethanesulfonate, dimethyl(2-oxocyclohexyl)sulfonium trifluoromethanesulfonate, diphenyliodonium hexafluoroantimonate, triphenylsulfonium camphorsulfonate, (4-hydroxyphenyl)benzylmethylsulfonium toluenesulfonate, 1-naphthyldimethylsulfonium trifluoromethanesulfonate, 1-naphtyldiethylsulfonium trifluoromethanesulfonate, 4-cyano-1-naphtyldimethylsulfonium trifluoromethanesulfonate, 4-nitro-1-naphtyldimethylsulfonium trifluoromethanesulfonate, 4-methyl-1-naphtyldimethylsulfonium trifluoromethanesulfonate, 4-cyano-1-naphtyldiethylsulfonium trifluoromethanesulfonate, 4-nitro-1-naphtyldiethylsulfonium trifluoromethanesulfonate, 4-methyl-1-naphtyldiethylsulfonium trifluoromethanesulfonate, 4-hydroxy-1-naphtyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-methoxymethoxy-1-naphtyltetrahydrothiophenium trifluoromethanesulfonate, 4-ethoxymethoxy-1-naphtyltetrahydrothiophenium trifluoromethanesulfonate, 4-(1-methoxyethoxy)-1-naphtyltetrahydrothiophenium trifluoromethanesulfonate, 4-(2-methoxyethoxy)-1-naphtyltetrahydrothiophenium trifluoromethanesulfonate, 4-methoxycarbonyloxy-1-naphtyltetrahydrothiophenium trifluoromethanesulfonate, 4-ethoxycarbonyloxy-1-naphtyltetrahydrothiophenium trifluoromethanesulfonate, 4-n-propoxycarbonyloxy-1-naphtyltetrahydrothiophenium trifluoromethanesulfonate, 4-i-propoxycarbonyloxy-1-naphthyltetrahydrothiophenium trifluoromethanesulfonate, 4-n-butoxycarbonyloxy-1-naphtyltetrahydrothiophenium trifluoromethanesulfonate, 4-t-butoxycarbonyloxy-1-naphtyltetrahydrothiophenium trifluoromethanesulfonate, 4-(2-tetrahydrofuranyloxy)-1-naphtyltetrahydrothiophenium trifluoromethanesulfonate, 4-(2-tetrahydropyranyloxy)-1-naphtyltetrahydrothiophenium trifluoromethanesulfonate, 4-benzyloxy-1-naphtyltetrahydrothiophenium trifluoromethanesulfonate, 1-(naphtylacetomethyl)tetrahydrothiophenium trifluoromethanesulfonate; halogen-containing compound photoacid generators such as phenylbis(trichloromethyl)-s-triazine, methoxyphenyl-bis(trichloromethyl)-s-triazine, and naphthyl-bis(trichloromethyl)-s-triazine; diazoketone compound photoacid generators such as 1,2-naphthoquinonediazido-4-sulfonylchloride, 1,2-naphthoquinonediazido-5-sulfonylchloride, 1,2-naphthoquinonediazido-4-sulfonate of 2,3,4,4'-tetrabenzophenone, and 1,2-naphthoquinonediazido-5-sulfonate of 2,3,4,4'-tetrabenzophenone; sulfonic acid compound photoacid generators such as 4-trisphenacylsulfone, mesitylphenacylsulfone, and bis(phenylsulfonyl) methane; and a sulfonic acid compound photoacid generator such as benzointosylate, tris(trifluoromethanesulfonate) of pyrogallol, nitrobenzyl-9,10-diethoxyanthracene-2-sulfonate, trifluoromethanesulfonyl bicyclo[2,2,1]hept-5-ene-2,3-dicarbodiimide, N-hydroxysuccinimide trifluoromethanesulfonate, 1,8-naphthalenedicarboxylic acid imide trifluoromethanesulfonate. These photoacid generators can be used either individually or in combination of two or more.

[Solvent]

Examples of the organic solvents used for the under-layer film composition include aliphatic hydrocarbon solvents such as n-pentane, i-pentane, n-hexane, i-hexane, n-heptane, i-heptane, 2,2,4-trimethylpentane, n-octane, i-octane, cyclohexane, and methyl cyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyhydric alcohol solvents such as ethyl ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethyl nonanon, cyclohexanone, methylcyclohexanone, 2,4-pentanedione, acetonyl acetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone.

The solvents shown by the following formula (10) are preferably used in the present invention.

$$R^{19}O(R^{21}O)_eR^{20} \tag{10}$$

wherein $R^{19}$ and $R^{20}$ individually represent a hydrogen atom or a monovalent organic group selected from the group consisting of an alkyl group having 1 to 4 carbon atoms and a group shown by $CH_3CO-$, $R^{21}$ represents an alkylene group having 2 to 4 carbon atoms, and e is 1 or 2.

As preferable examples of the solvent shown by the formula (10), propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate, and propylene glycol can be given. Among these, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable due to excellent storage stability. These solvents may be used either individually or in combination of two or more.

The water content of the composition for the under-layer film is preferably more than 1 mass %, but not more than 15 mass %. If the water content is less than 1 mass %, a residue tends to be generated on the surface of the upper-layer film for patterning when the upper-layer film is developed after the composition has been stored for a long time. If the water content is more than 15 mass %, the composition has impaired applicability.

In addition, the content of sodium and iron is preferably not more than 20 ppb, and particularly preferably not more than 15 ppb in order to reduce etching failure. Since sodium and iron may mix in from the raw material, it is preferable to refine the raw material by distillation and the like.

The content of the acid generator in the composition for the under-layer film is preferably 1 to 30 parts by weight, and more preferably 1 to 10 parts by weight for 100 parts by weight of the hydrolyzed components (as complete hydrolysis-condensate) obtained from the compounds shown by the formula (1) and formula (2). If the content of the acid generator is less than 1 part by weight, patterning failures may occur due to an insufficient amount of acid generated. Such patterning failures include lack of necessary patterns due to insufficient curing of the upper-layer film for patterning, a residue on the upper-layer film left in the area in which patterning is unnecessary due to an insufficient deprotecting reaction, and the like. If the content of the acid generated is more than 30 parts by weight, patterning failures may occur due to an excessive amount of acid generated. Such patterning failures include excessive curing of the upper-layer film for patterning, upper-layer film components left in the area in which patterning is unnecessary, dissolution of patterns in the area in which patterning is necessary due to an excessive deprotecting reaction, and the like.

The following components may be added to the under-layer film composition.

[β-diketone]

As β-diketone, one or more compounds such as acetylacetone, 2,4-hexane dione, 2,4-heptane dione, 3,5-heptane dione, 2,4-octane dione, 3,5-octane dione, 2,4-nonane dione, 3,5-nonane dione, 5-methyl-2,4-hexane dione, 2,2,6,6-tetramethyl-3,5-heptane dione, 1,1,1,5,5,5-hexafluoro-2,4-heptane dione, and the like may be used.

The amount of β-diketone used in the under-layer film composition is 1 to 50 wt %, and preferably 3 to 30 wt % of the total amount of the solvent.

Addition of β-diketone in this range ensures some level of storage stability and eliminates possibility of deterioration of the under-layer film composition such as a decrease in capability of forming a uniform film.

[Others]

Other components such as colloidal silica, colloidal alumina, organic polymers, and surfactants may be added to the under-layer film composition obtained in the present invention.

Colloidal silica is a dispersion of high purity silicic anhydride, for example, having an average particle diameter of usually 5 to 30 nm, and preferably 10 to 20 nm, and a solid component concentration of 10 to 40 mass % in the above-mentioned hydrophilic organic solvent.

As examples of such colloidal silica, methanol silica sol and isopropanol silica sol manufactured by Nissan Chemical Industries, Ltd., Oscar manufactured by Catalysts & Chemicals Industries Co., Ltd., and the like can be given.

As colloidal alumina, Alumina Sol 520, Alumina Sol 100, and Alumina Sol 200 manufactured by Nissan Chemical Industries, Ltd., Alumina Clear Sol, Alumina Sol 10, Alumina Sol 132 manufactured by Kawaken Fine Chemicals Co., Ltd., and the like can be given.

As examples of the organic polymer, a compound having a polyalkylene oxide structure, a compound having a sugar chain structure, a vinyl amide polymer, a (meth)acrylate compound, an aromatic vinyl compound, a dendrimer, polyimide, polyamic acid, polyarylene, polyamide, polyquinoxaline, polyoxadiazole, fluorine-containing polymer, and the like can be given.

As surfactants, a nonionic surfactant, an anionic surfactant, a cationic surfactant, an amphoteric surfactant, and the like can be given. In addition, a silicon-containing surfactant, a polyalkylene oxide surfactant, a fluorine-containing surfactant, an acrylic surfactant, and the like may be given.

As specific examples of the surfactant, polyoxyethylene alkyl ethers such as polyoxyethylene lauryl ether, polyoxyethylene stearyl ether, and polyoxyethylene oleyl ether; polyoxyethylene alkyl phenyl ethers such as polyoxyethylene n-octylphenyl ether and polyoxyethylene n-nonylphenyl ether; polyethylene glycol diesters such as polyethylene glycol dilaurate and polyethylene glycol distearate; sorbitan fatty acid esters; fatty acid-modified polyesters; tertiary amine-modified polyurethanes; and polyethylene imines; commercially available products such as KP (manufactured by Shin-Etsu Chemical Co., Ltd.), Polyflow (manufactured by Kyoeisha Chemical Co., Ltd.), EFTOP (manufactured by Tohkem Products Corporation), MEGAFAC (manufactured by Dainippon Ink and Chemicals, Inc.), Fluorad (manufactured by Sumitomo 3M, Ltd.), Asahi Guard and Surflon (manufactured by Asahi Glass Co., Ltd.), Disperbyk (manufactured by BYK Japan KK), SORSPERSE (manufactured by Zeneka Co.), and the like can be given. These surfactants may be used either individually or in combination of two or more.

The concentration of solid components in the under-layer film composition may be adjusted according to the purpose of use, preferably in the range from 1 to 20 mass %. If the solid component concentration is in the range of 1 to 20 mass %, the coated film has a thickness in an appropriate range and has excellent storage stability.

The total polyorganosiloxane components (hydrolysis-condensates of the compounds of the formula (1) and/or formula (2)) in the composition obtained in this manner has an average molecular weight usually of 500 to 120,000, and preferably 800 to 100,000.

As the upper-layer film composition for patterning used in the pattern forming method mentioned above, at least one of the hydrolyzates or condensates of the compound shown by the following formula (1) can be given.

$$R^1_a Si(OR^2)_{4-a} \qquad (1)$$

wherein $R^1$ represents an alkyl group having 1 to 10 carbon atoms or an aryl group, $R^2$ represents a hydrogen atom or a monovalent organic group, and a is an integer from 0 to 2.

As examples of the monovalent organic group represented by $R^1$ and $R^2$ of the formula (1), a substituted or unsubstituted alkyl group, aryl group, allyl group, glycidyl group, and the like can be given. A monovalent organic group, particularly an alkyl group or a phenyl group is preferable as $R^1$ in the formula (1).

Examples of the alkyl group include a methyl group, an ethyl group, a propyl group, and a butyl group. The alkyl group preferably has 1 to 5 carbon atoms, may be either linear or branched, and one or more hyrogen atoms of the alkl group may be substituted by a fluorine atom.

As examples of the aryl group in the formula (1), a phenyl group, a naphthyl group, a methylphenyl group, an ethylphenyl group, a chlorophenyl group, a bromophenyl group, a fluorophenyl group, a substation group having a liquid crystalline unit such as a derivative having a biphenyl group, a functional group having a self-organizing unit such as a derivative containing polythiophene, and the like can be given.

As examples of the upper-layer film composition for patterning used in the pattern-forming method, polymers shown by the following formulas can be given,

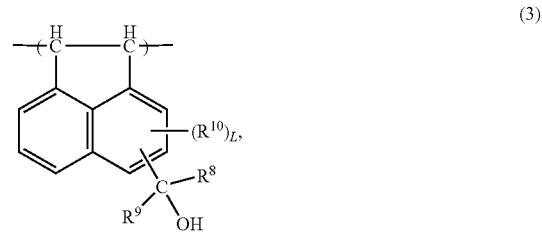

(3)

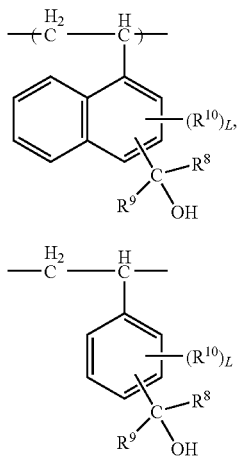

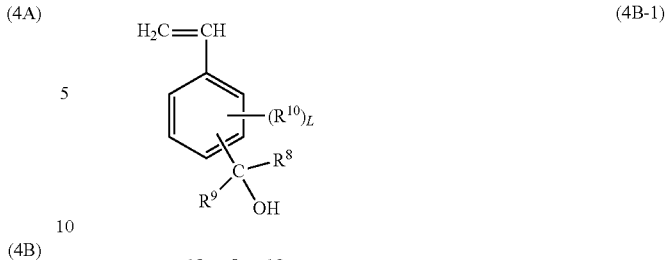

wherein $R^8$ and $R^9$ represent a hydrogen atom, an alkyl group having 1 to 3 carbon atoms, or an aryl group, $R^{10}$ is an alkyl group having 1 to 3 carbon atoms, a vinyl group, an allyl group, or an aryl group, and L indicates 0, 1, or 2.

The polymer including the repeating unit (3), the repeating unit (4A), and/or the repeating unit (4B) produces a carbocation ($-CR_2^+$) when the $-CR_2OH$ group on the side chain reacts with an acid ($H^+$) remaining in the resist pattern 2, and the cation reacts with the $-CR_2OH$ group to crosslink.

In the repeating unit (3), the repeating unit (4A), and/or the repeating unit (4B), as the alkyl group having 1 to 3 carbon atoms represented by $R^8$, $R^9$, and $R^{10}$, a methyl group, an ethyl group, an n-propyl group, and an i-propyl group can be given.

A phenyl group, a tolyl group, a naphthyl group, a biphenyl group, and the like can be given as the aryl group represented by $R^8$ and $R^9$.

Polymers having a structure of the formulas in which $R^8$ and $R^9$ are hydrogen atoms, and m and L are 0 are particularly preferable used in the present invention.

The repeating unit (3), the repeating unit (4A), and the repeating unit (4B) may be obtained by polymerizing the monomers shown by the following formula (3-1), formula (4A-1), and formula (4B-1).

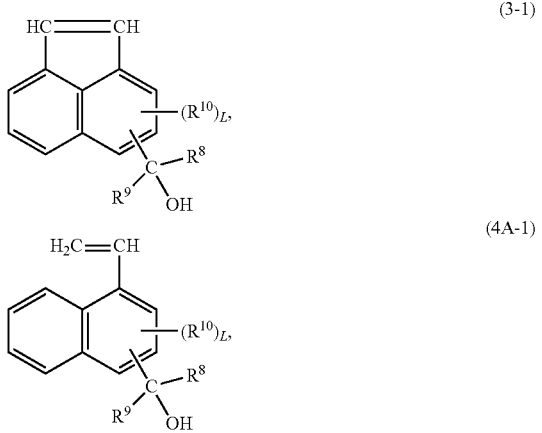

wherein $R^{18}$, $R^9$, $R^{10}$, and L are respectively the same as those defined in the formulas (3), (4A), and (4B).

The repeating unit (3), the repeating unit (4A), and/or the repeating unit (4B) are contained in the amount of usually 10 to 70 mol %, and preferably 30 to 50 mol % of the total amount of the polymer. The amount of the repeating uint (3), the repeating unit (4A), and/or the repeating unit (4B) in the above range increases the etching resistance. If the amount of the repeating unit (3), the repeating unit (4A), and/or the repeating unit (4B) is less than 30 mol %, the crosslinking performance may be impaired; if more than 70 mol %, solubility in a solvent may be decreased.

The upper-layer film composition for patterning used in the pattern-forming method may contain repeating units other than the repeating unit (3), the repeating unit (4A), and/or the repeating unit (4B). As examples of such other repeating units, hydroxystyrene, 2-hydroxyethyl methacrylate, glycidyl methacrylate, N-methylacrylamide, p-hydroxymethacrylanilide, and the like can be given.

The other repeating units may be present either individually or in combination of two or more. The content of the other repeating units in the polymer is preferably 30 to 90 mol %, and more preferably 50 to 70 mol %.

The polystyrene-reduced weight average molecular weight (hereinafter referred to as "Mw") of the polymer containing the repeating unit (3), the repeating unit (4A), and/or the repeating unit (4B) determined by gel permeation chromatography (GPC) is usually 500 to 500,000, preferably 500 to 100,000, more preferably 800 to 50,000, and still more preferably 800 to 10,000. If the Mw is less than 500, the components may volatilize at the time of baking the film, failing to obtain a desired film thickness; if more than 500,000, solubility in a solvent may decrease.

The polymer can be prepared by, for example, polymerizing polymerizable unsaturated monomers corresponding to each of the above repeating units forming a desired molecular composition in an appropriate solvent in the presence of a radical polymerization initiator, a chain transfer agent, and the like. It is desirable to add a sufficient amount of the radical polymerization initiator in order to realize a sufficient polymerization rate. If the ratio of the amount of the radical polymerization initiator to the amount of the chain transfer agent is too high, a radical-radical coupling reaction may occur resulting in production of an undesirable non-living radical polymerization product. The resulting polymer may include portions possessing uncontrolled characteristics such as the molecular weight and molecular weight distribution. The molar ratio of the radical polymerization initiator to the chain transfer agent is preferably 1:1 to 0.005:1.

Examples of the radical polymerization initiator include, but are not particularly limited to, a thermal polymerization initiator, a redox polymerization initiator, and a photoinitiator. As specific examples, initiators such as a peroxide and an azo compound can be given. As more specific examples of the radical polymerization initiator, t-butylhydroperoxide, t-butylperbenzoate, benzoyl peroxide, 2,2'-azobis(2,4-dimethylvaleronitrile), 2,2'-azobisisobutyronitrile (AIBN), 1,1'-azobis(cyclohexanecarbonitrile), and dimethyl-2,2'-azobisisobutyrate (MAIB) can be given.

As examples of the chain transfer agent, pyrazole derivatives, alkyl thiols, and the like can be given.

The polymerization may be carried out by common batch polymerization, drop polymerization, and the like. For example, necessary types of the above monomers (3-1), (4A-1), and (4B-1), and monomers corresponding to the other repeating units in necessary amounts are dissolved in an organic solvent and polymerized in the presence of a radical polymerization initiator and a chain transfer agent to obtain the polymer of the vinyl naphthalene derivative of the embodiment. An organic solvent capable of dissolving the monomers, radical polymerization initiator, and chain transfer agent is generally used as the polymerization solvent. As examples of the organic solvent, alcohol solvents, ketone solvents, ether solvents, aprotic polar solvents, ester solvents, aromatic solvents, and linear or cyclic aliphatic solvents can be given. As alcohol solvents, 2-propanol, butanol, propylene glycol monomethyl ether, and the like can be given. As ketone solvents, methyl ethyl ketone, acetone, and the like can be given. Examples of the ethers include alkoxyalkyl ether, such as methoxymethyl ether, ethyl ether, tetrahydrofuran, and 1,4-dioxane. Examples of the aprotic polar solvents include dimethylformamide, dimethyl sulfoxide, and the like. As ester solvents, alkyl acetates such as ethyl acetate, methyl acetate, and the like can be given. Examples of the aromatic solvents include alkylaryl solvents such as toluene and xylene, and halogenated aromatic solvents such as chlorobenzene. Examples of the aliphatic solvents include hexane, cyclohexane, and the like.

The polymerization temperature is usually 20 to 120° C., preferably 50 to 110° C., and more preferably 60 to 100° C. Although the polymerization may be conducted in a normal atmosphere in some cases, the polymerization is preferably conducted in an inert gas atmosphere such as nitrogen or argon. The molecular weight of the vinyl naphthalene derivative polymer of the embodiment can be adjusted by controlling the ratio of the monomers and the chain transfer agent. The polymerization time is usually 0.5 to 144 hours, preferably 1 to 72 hours, and more preferably 2 to 24 hours.

The above polymer can be suitably used as a resin component of the upper-layer film composition for patterning used in the pattern forming method of the present invention.

The solvent used in the upper-layer film composition for patterning may be appropriately selected from alcohols such as methanol, ethanol, 2-propanol, 1-butanol, 2-butanol, 1-pentanol, 2-pentanol, 3-pentanol, 1-hexanol, 2-hexanol, 3-hexanol, 2-methyl-1-butanol, 2-methyl-3-pentanol, 3-methyl-1-pentanol, 3-methyl-2-pentanol, and 4-methyl-2-pentanol; ethers such as diethyl ether, diisopropyl ether, dipropyl ether, and dibutyl ether; and the like, without particular limitations insofar as the solvent does not dissolve an organic resist film for ArF having a polyacrylate or polymethacrylate structure.

Among these solvents, 1-butanol, 2-butanol, 1-pentanol, 2-pentanol, 4-methyl-2-pentanol, and the like are preferable. These solvents may be used either individually or in combination of two or more. These solvents may be used in an amount to make the solid content of the resulting composition preferably 0.01 to 70 mass %, more preferably 0.05 to 60 mass %, and particularly preferably 0.1 to 50 mass %.

Various additives such as crosslinking agents, binder resins, and surfactants can be optionally added to the upper-layer film composition for patterning.

The crosslinking agent is a component accelerating the curing reaction of a planarized film made of the polymer having the repeating unit (3), the repeating unit (4A), and/or the repeating unit (4B). As the crosslinking agent, polynuclear phenols and various commercially-available curing agents may be used. Examples of the polynuclear phenols include binuclear phenols such as 4,4'-biphenyldiol, 4,4'-methylenebisphenol, 4,4'-ethylidenebisphenol, and bisphenol A; trinuclear phenols such as 4,4',4''-methylidenetrisphenol, and 4,4'-[1-{4-(1-[4-hydroxyphenyl]-1-methylethyl)phenyl}ethylidene]bisphenol; and polyphenols such as novolak. Of the above polynuclear phenols, 4,4'-[1-{4-(1-[4-hydroxyphenyl]-1-methylethyl)phenyl}ethylidene]bisphenol and novolak are preferable. These polynuclear phenols may be used either individually or in combination of two or more.

Examples of the curing agent include diisocyanates such as 2,3-tolylenediisocyanate, 2,4-tolylenediisocyanate, 3,4-tolylenediisocyanate, 3,5-tolylenediisocyanate, 4,4'-diphenylmethanediisocyanate, hexamethylenediisocyanate, and 1,4-cyclohexanediisocyanate; epoxy compounds available under the trade names of Epicoat 812, Epicoat 815, Epicoat 826, Epicoat 828, Epicoat 834, Epicoat 836, Epicoat 871, Epicoat 1001, Epicoat 1004, Epicoat 1007, Epicoat 1009, and Epicoat 1031 (manufactured by Yuka-Shell Epoxy Co., Ltd.), Araldite 6600, Araldite 6700, Araldite 6800, Araldite 502, Araldite 6071, Araldite 6084, Araldite 6097, and Araldite 6099 (manufactured by Ciba Geigy Corp.), DER 331, DER 332, DER 333, DER 661, DER 644, and DER 667 (manufactured by Dow Chemical Company); melamine curing agents such as Cymel 300, Cymel 301, Cymel 303, Cymel 350, Cymel 370, Cymel 771, Cymel 325, Cymel 327, Cymel 703, Cymel 712, Cymel 701, Cymel 272, Cymel 202, Mycoat 506, and Mycoat 508 (manufactured by Mitsui-Cyanamid Ltd.); benzoguanamine curing agents such as Cymel 1123, Cymel 1123-10, Cymel 1128, Mycoat 102, Mycoat 105, Mycoat 106, and Mycoat 130 (manufactured by Mitsui-Cyanamid Ltd.); and glycoluril curing agents such as Cymel 1170 and Cymel 1172 (manufactured by Mitsui-Cyanamid Ltd.), and NIKALAC N-2702 (manufactured by Sanwa Chemical Co., Ltd.). Among these curing agents, the melamine curing agents and the glycoluril curing agents are preferable. These curing agents may be used either individually or in combination of two or more. The polynuclear phenols and the curing agents may be used in combination as the crosslinking agent.

The amount of the crosslinking agent is preferably 50 mass % or less, and more preferably 30 mass % or less of the solid component contained in the resulting composition.

As the binder resin, various thermoplastic resins and thermosetting resins may be used. Examples of the thermoplastic resin include α-olefin polymers such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene, and polyvinyl cycloalkane; non-conjugated diene polymers such as poly-1,4-pentadiene, poly-1,4-hexadiene, and poly-1,5-hexadiene; α,β-unsaturated aldehyde polymers; α,β-unsaturated ketone polymers such as poly(m-ethyl vinyl ketone), poly(aromatic vinyl ketone), and poly(cyclic vinyl ketone); α,β-unsaturated carboxylic acid polymers or α,β-unsaturated carboxylic acid derivative polymers such as (meth)acrylic acid, α-chloroacrylic acid, (meth)acrylic acid salt, (meth)acrylate, and halogenated (meth)acrylic acid; α,β-unsaturated carboxylic acid anhydride polymers such as a copolymer of poly(meth)acrylic acid anhydride and maleic acid unhydride; unsaturated polybasic calboxylate polymers such as polymers of methylene malonic acid diester, itaconic acid diester, or the like; polymers of diolefin calboxylate such as sorbic acid ester, muconic acid ester, or the like; α,β-unsaturated carboxylic acid thioester polymers such as (meth)acrylic acid thioester and α-chloroacrylic acid thioester; polymers of (meth)acrylonitrile or derivatives thereof such as (meth)acrylonitrile, α-chloroacrylonitrile, and the like; polymers of (meth)acrylamide or derivatives thereof such as (meth)acrylamide, N,N-dimethyl(meth)acrylamide, and the like; polymers of a styryl metal compound; polymers of a vinyloxy metal compound; polyimines; polyethers such as polyphenyleneoxide, poly-1,3-dioxolan, polyoxolan, polytetrahydrofuran, and polytetrahydropyrane; polysulfides; polysulfoneamides; polypeptides; polyamides such as nylon 66 and nylons 1 to 12 and the like; polyesters such as aliphatic polyesters, aromatic polyesters, alicyclic polyesters, and polycarbonate esters; polyureas; polysulfones; polyazines; polyamines; polyaromatic ketones; polyimides; polybenzoimidazoles; polybenzooxazols; polybenzothiazoles; polyaminotriazoles; polyoxadiazoles; polypyrazoles; polytetrazoles; polyquinoxalines; polytriazines; polybenzoxadinones; polyquinolines; and polyanthrazolines.

The thermosetting resin is a component which is cured by heating and becomes insoluble in a solvent. The thermosetting resin is suitably used as a binder resin due to its effect of preventing intermixing with the resist pattern 2. As examples of the thermosetting resin, thermosetting acrylic resins, phenol resins, urea resins, melamine resins, amino resins, aromatic hydrocarbon resins, epoxy resins, alkyd resins, and the like can be given. Of these thermosetting resins, urea resins, melamine resins, and aromatic hydrocarbon resins are preferable.

The binder resins may be used either individually or in combination of two or more. The amount of the binder resin is preferably 20 mass % or less, and more preferably 10 mass % or less of the solid component contained in the resulting composition.

The surfactant improves applicability, striation, wetability, developability, and the like. As examples of such surfactants, nonionic surfactants such as polyoxyethylene lauryl ether, polyoxyethylene stearyl ether, polyoxyethylene oleyl ether, polyoxyethylene-n-octylphenyl ether, polyoxyethylene-n-nonyl phenyl ether, polyethylene glycol dilaurate, polyethylene glycol distearate, and the like; commercially available products such as KP341 (manufactured by Shin-Etsu Chemical Co., Ltd.), Polyflow No. 75 and No. 95 (manufactured by Kyoeisha Chemical Co., Ltd.), FTOP EF 101, EF 204, EF 303, and EF 352 (manufactured by Tohkem Products Corporation); MEGAFAC F171, F172, and F173 (manufactured by Dainippon Ink and Chemicals, Inc.); Fluorad FC430 FC431, FC135, and FC93 (manufactured by Sumitomo 3M Ltd.); Asahi Guard AG710, Surflon S-382, SC-101, SC-102, SC-103, SC-104, SC-105, and SC-106 (manufactured by Asahi Glass Co., Ltd.); and the like can be given. The surfactants may be used either individually or in combination of two or more. The amount of the surfactant is preferably 15 mass % or less, and more preferably 10 mass % or less of the solid component contained in the resulting composition. Other additives which may be used include a preservative, an antifoaming agent, an adhesive adjuvant, and the like.

The solid concentration of the composition containing a polymer having the repeating unit (1) and/or the repeating unit (2) in the upper-layer film composition for patterning is preferably 0.05 to 60 mass %, and more preferably 0.1 to 50 mass %.

If the solid concentration is less than 0.05 mass %, the coating may be too thin to sufficiently cover resist patterns; if more than 60 mass %, the composition may have a high viscosity and may cause a coating failure, with a consequence of leaving unfilled fine patterns.

The proportion of the polymer having the repeating unit (3), the repeating unit (4A), and/or the repeating unit (4B) in the entire resin composition is preferably 60 mass % or more.

The upper-layer film composition for patterning which contains the polymer having the repeating unit (3), the repeating unit (4A), and/or the repeating unit (4B) as resin components can be very suitably used in microfabrication using a lithography process in which various types of radiation such as ultraviolet radiation, deep ultraviolet rays, electron beams, and X-rays are used, such as in fabrication of integrated circuit boards.

As examples of the upper-layer film composition for patterning used in the pattern-forming method, polymers having the structural unit shown by the following formula can be given,

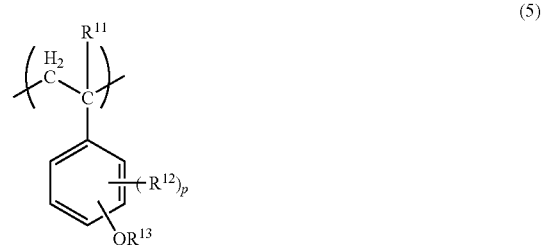

(5)

wherein $R^{11}$ and $R^{12}$ show a hydrogen atom, an alkyl group having 1 to 3 carbon atoms, or an aryl group, $R^{13}$ represents a hydrogen atom, an alkyl group having 1 to 10 carbon atoms, a vinyl group, an allyl group, or an aryl group, and p is 0, 1, or 2.

The above-described crosslinking agents can be suitably used for the upper-layer film composition for patterning used in the pattern forming method of the present invention. The crosslinking reaction proceeds by the reaction of the crosslinking agent and the oxygen atom in the structural unit shown by the formula (5) initiated by the action of an acid.

Various additives such as the above-mentioned binder resins, surfactants, and the like can be optionally added to the upper-layer film composition for patterning.

As examples of the upper-layer film composition for patterning used in the pattern-forming method, polymers having the structural unit shown by the following formula can be given,

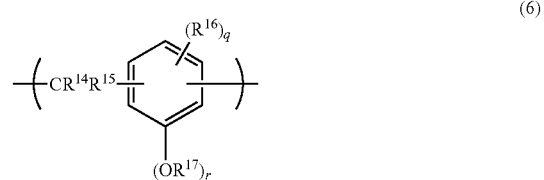

(6)

wherein $R^{14}$ and $R^{15}$ show a hydrogen atom, an alkyl group having 1 to 3 carbon atoms, or an aryl group, $R^{16}$ represents an alkyl group having 1 to 10 carbon atoms, a vinyl group, an allyl group, or an aryl group, $R^{17}$ represents a hydrogen atom, an alkyl group having 1 to 10 carbon atoms, or an aryl group, q is 0, 1, or 2, and r is 1, 2, or 3.

The above-described crosslinking agents can be suitably used for the upper-layer film composition for patterning used in the pattern forming method of the present invention. The crosslinking reaction proceeds by the reaction of the crosslinking agent and the oxygen atom in the structural unit shown by the formula (5) initiated by the action of an acid.

Various additives such as the above-mentioned binder resins, surfactants, and the like can be optionally added to the upper-layer film composition for patterning.

As examples of the upper-layer film composition for patterning used in the pattern-forming method, a composition, of which the molecular weight is increased as a result of polymerization, is a polymer having the structural unit shown by the following formula can be given.

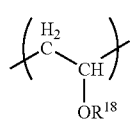
(7)

wherein $R^{18}$ represents a hydrogen atom, an alkyl group having 1 to 10 carbon atoms, or an aryl group.

The repeating unit (7) can be obtained by polymerizing the monomer shown by the following formula (11),

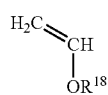
(11)

wherein $R^{18}$ represents a hydrogen atom, an alkyl group having 1 to 10 carbon atoms, or an aryl group.

The monomer shown by the formula (11) is polymerized by cationic polymerization by the action of the acid in the under-layer film to produce a polymer having the structural unit shown by the formula (7) on the under-layer film.

The monomer shown by the formula (11) may be coated on the under-layer film. Alternatively, when the monomer is volatile, it is possible to expose the under-layer film to the monomer gas in a container.

The composition according to the present invention can be very suitably used without using a general photoresist for microfabrication of integrated circuit boards and the like using a lithography process in which various types of radiation such as electron beams, X-rays, and deep ultraviolet rays are used.

A wide variety of compositions can be used as the upper-layer film composition for patterning of the present invention irrespective of the structure insofar as the composition is cured by the action of an acid. For example, a pattern shape control by means of pattern draw-up is possible, if an easily chargeable composition is used in combination with an externally charged electric field as described in Japanese Patent No. 3774739, for example.

EXAMPLES

The present invention will be described below in more detail by way of examples. The present invention, however, is not limited to the following examples. In the examples, "part" refers to "part by mass" unless otherwise indicated. Measurement and evaluation in the examples and comparative examples were carried out according to the following procedures.

Example 1

Preparation of Under-Layer Film Composition (A)

A composition (A) containing a hydrolyzate-condensate (resin) of monomers $Si(OCH_3)_4$ and $H_3CSi(OCH_3)_3$ was prepared as follows.
[Composition (A) Containing a Hydrolyzate-Condensate (Resin) of Monomers $Si(OCH_3)_4$ and $H_3CSi(OCH_3)_3$]

A maleic acid aqueous solution (0.8 parts of maleic acid and 34 parts of distilled water) was added dropwise to 40 parts of a solution of $Si(OCH_3)_4$ and 8 parts of $H_3CSi(OCH_3)_3$ in 117 parts of 1-ethoxy-2-propanol heated at 60° C. The solution was stirred at 60° C. for four hours and concentrated under reduced pressure to obtain 100 parts of a resin solution (a).

The Mw of the polymer was 2000. The Mw was measured by gel permeation chromatography (GPC) using GPC columns (manufactured by Tosoh Corp., G2000HXL×2, G3000HXL×1, G4000HXL×1) under the conditions of a flow rate of 1.0 ml/minute and a column temperature of 40° C. using tetrahydrofuran as an eluate and monodispersed polystyrene as a standard reference material.

80 parts of a under-layer film composition (A) was obtained by adding 0.5 parts of triphenylsulfonium triflate to 13 parts of the resin solution (a) and diluting the resulting mixture with 13 parts of 1-ethoxy-2-propanol and 2 parts of distilled water.
[Upper-Layer Film Composition for Patterning (I)]

The resin solution (a) used for preparing the under-layer film was used as is as the upper-layer film composition for patterning (I).
[Formation of Under-Layer Film and Partial Exposure]

The under-layer film composition was applied to an 8 inch silicon wafer by spin coating and heated on a hot plate at 200° C. for 60 seconds, then on another hot plate at 300° C. for 60 seconds, to obtain a under-layer film with a thickness of 80 nm on the silicon wafer. The silicon wafer was exposed to radiation through a mask pattern for a specified irradiation time using an electron beam drawing apparatus manufactured by Hitachi, Ltd.
[Formation of Upper-Layer Film Composition for Patterning and Formation of Pattern (1)]

After spin coating the upper-layer film for patterning (I) on the under-layer film, the coating was heated on a hot plate at 155° C. for 90 seconds. The resist was developed in a 2.38 mass % tetramethylammonium hydroxide aqueous solution at 25° C. for 90 seconds, washed with water, and dried to form a 3×3 mm pattern (1).

Example 2

The under-layer film composition (A) used in Example 1 was utilized.
[Upper-Layer Film Composition for Patterning (II)]

Commercially available phenyltrimethoxysilane was used as is.

Formation of the under-layer film and partial exposure were carried out according to Example 1.
[Formation of Upper-Layer Film Composition for Patterning and Formation of Pattern (2)]

After spin coating the upper-layer film for patterning (II) on the under-layer film, the coating was heated on a hot plate at 100° C. for 60 seconds. The resist was developed using 2-propanol at 25° C. for 10 seconds, washed with water, and dried to form a 3×3 mm pattern (2).

Example 3

The under-layer film composition (A) used in Example 1 was utilized.

[Upper-Layer Film Composition for Patterning (II)]

A polymer (b) having a repeating unit of hydroxymethylacenaphthylene was prepared and the composition for patterning (III) was prepared using the polymer (b).

[Polymer (b) Having a Repeating Unit of Hydroxymethylacenaphthylene]

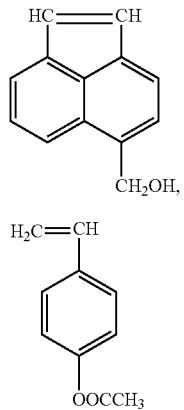

A separable flask equipped with a thermometer was charged with a mixed solution of 9 parts by mass of 4-acetoxystyrene (P-1-2), 6 parts by mass of 5-hydroxymethylacenaphthylene (P-1-1), 180 parts by mass of propylene glycol monomethyl ether, and 5 parts by mass of dimethyl-2,2'-azobisisobutyrate in a nitrogen atmosphere. The mixture was polymerized at 60° C. for six hours while stirring. The mixture was rised to 95° C. and heated for one hour. The resulting reaction solution was condensed to one half by mass and poured into a large amount of heptane to reprecipitate the reaction product. A separable flask equipped with a thermometer was charged with all the amount of the resulting solid components, 100 parts by mass of tetrahydrofuran, 100 parts by mass of methanol, 7 parts by mass of triethylamine, and 3 parts by mass of water. The mixture was refluxed for seven hours while heating and stirring under nitrogen atomosphere. The resulting reaction solution was condensed to one half by mass and poured into a large amount of heptane to obtain 18 g of a solid component. The Mw of the polymer was 1800. The Mw was measured by gel permeation chromatography (GPC) using GPC columns (manufactured by Tosoh Corp., G2000HXL×2, G3000HXL×1, G4000HXL×1) under the conditions of a flow rate of 1.0 ml/minute and a column temperature of 40° C. using tetrahydrofuran as an eluate and monodispersed polystyrene as a standard reference material. 10 parts by mass of the resulting polymer was dissolved in 190 parts of 4-methyl-2-pentanol to obtain an upper-layer film for patterning (III).

Formation of the under-layer film and partial exposure were carried out according to Example 1.

[Formation of Upper-Layer Film for Patterning and Formation of Pattern (3)]

After spin coating the upper-layer film composition for patterning (III) on the under-layer film, the coating was heated on a hot plate at 155° C. for 90 seconds. The resist was developed in a 2.38 mass % tetramethylammonium hydroxide aqueous solution at 25° C. for 60 seconds, washed with water, and dried to form a 3×3 mm pattern (3).

Example 4

The under-layer film composition (A) used in Example 1 was used.

[Upper-Layer Film Composition for Patterning (IV)]

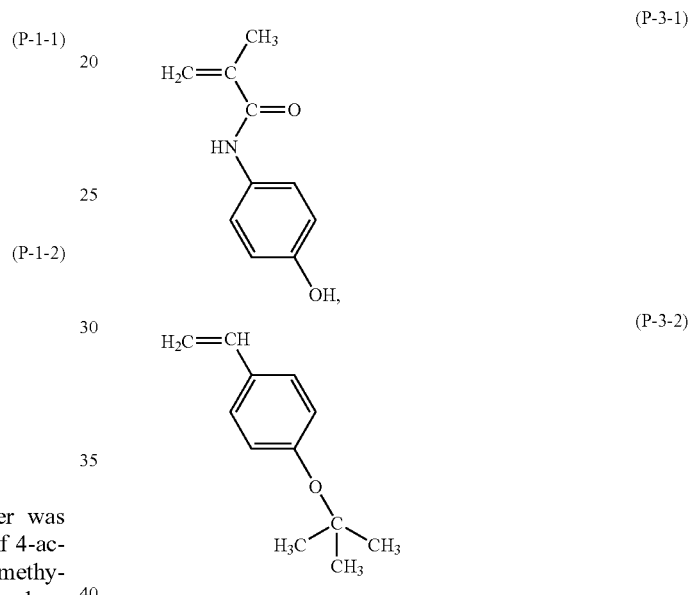

90 g of p-hydroxyphenyl methacryl anilide (P-3-1), 30 g of p-t-butoxystyrene (P-3-2), 9 g of azobisisobutyronitrile, and 5 g of 2,4-diphenyl-4-methyl-1-pentene were dissolved in methanol. The mixture was polymerized under refluxing (63° C.) for eight hours. The polymer solution was purified by reprecipitation using a methanol/water mixture, then using an isopropyl alcohol/heptane mixture to obtain a polymer with a molar ratio of p-hydroxyphenyl methacrylanilide/p-t-butoxystyrene=70/30, having an Mw of 7000 and an Mw/Mn of 1.77. This polymer is designated as a resin (c).

193 parts by mass of an upper-layer film composition (IV) was obtained by dissolving mixture of 10 parts by mass of the resin (c) and 3 parts by mass of NIKALAC MX-750 (manufactured by Sanwa Chemical Co., Ltd.) as a crosslinking agent in 180 parts by mass of 1-butanol.

Formation of the under-layer film and partial exposure were carried out according to Example 1.

[Formation of Upper-Layer Film for Patterning and Formation of Pattern (4)]

After spin coating the upper-layer film composition for patterning (IV) on the under-layer film, the coating was heated on a hot plate at 155° C. for 90 seconds. The resist was developed in a 2.38 mass % tetramethylammonium hydroxide aqueous solution at 25° C. for 60 seconds, washed with water, and dried to form a 3×3 mm pattern (4).

Example 5

The under-layer film composition (A) used in Example 1 was used.
[Upper-Layer Film Composition for Patterning (V)]

193 parts of an upper-layer film composition (V) was obtained by dissolving a mixture of 10 parts by mass of 1,3,5-tris(4-hydroxyphenyl)benzene and 3 parts by mass of NIKALAC MX-750 (manufactured by Sanwa Chemical Co., Ltd.) as a crosslinking agent in 180 parts by mass of ethyl lactate.

Formation of the under-layer film and partial exposure were carried out according to Example 1.
[Formation of Upper-Layer Film Composition for Patterning and Formation of Pattern (5)]

After spin coating the upper-layer film composition for patterning (V) on the under-layer film, the coating was heated on a hot plate at 155° C. for 90 seconds. The resist was developed in a 2.38 mass % tetramethylammonium hydroxide aqueous solution at 25° C. for 60 seconds, washed with water, and dried to form a 3×3 mm pattern (5).

Example 6

The under-layer film composition (A) used in Example 1 was used.
[Upper-Layer Film Composition for Patterning (VI)]

Commercially available cyclohexyl vinyl ether was used as is.

Formation of the under-layer film and partial exposure were carried out according to Example 1.
[Formation of Upper-Layer Film for Patterning and Formation of Pattern (6)]

After spin coating the upper-layer film composition for patterning (VI) on the under-layer film, the coating was allowed to stand overnight under a nitrogen atmosphere at room temperature. The resist was developed using methanol at 25° C. for 10 seconds, washed with water, and dried to form a 3×3 mm pattern (6).

Example 7

Preparation of Under-Layer Film Composition (B)

A under-layer film composition (B) containing a resin obtained by radical polymerization of acenaphthylene and 5-hydroxymethylacenaphthylene was prepared.

A separable flask equipped with a thermometer was charged with acenaphthylene (8 parts), 5-hydroxymethylacenaphthylene (4 parts), n-butyl acetate (50 parts), and azobisisobutyronitrile (4 parts). The mixture was polymerized at 80° C. for seven hours while stirring under nitrogen atomosphere. After the reaction, the reaction mixture was diluted with 100 parts of n-butyl acetate and the organic layer was washed with a large amount of a mixed solvent of water and methanol (weight ratio=1:2). The solvent was evaporated to obtain a polymer (d) with an Mw of 1500.

One part by mass of the polymer (d) and 0.1 part of triphenylsulfonium triflate were dissolved in 20 parts by mass of ethyl lactate to obtain 21.1 parts by mass of an under-layer film composition (B).
[Upper-Layer Film Composition for Patterning (I)]

The resin solution (a) was used as (I) as is.

Formation of the under-layer film and partial exposure were carried out according to Example 1.

[Formation of Upper-Layer Film for Patterning and Formation of Pattern (7)]

After spin coating the upper-layer film composition for patterning (I) on the under-layer film, the coating was heated on a hot plate at 155° C. for 60 seconds. The resist was developed in a 2.38 mass % tetramethylammonium hydroxide aqueous solution at 25° C. for 60 seconds, washed with water, and dried to form a 3×3 mm pattern (7).

Example 8

The under-layer film composition (A) used in Example 1 was utilized.
[Upper-Layer Film Composition for Patterning (IV)]

The upper-layer film composition (IV) used in Example 4 was utilized.

The under-layer film was formed according to Example 1.
[Formation of Upper-Layer Film for Patterning and Formation of Pattern (8)]

A coating obtained by spin coating the upper-layer film composition for patterning (IV) on the under-layer film was exposed to radiation through a mask pattern for a specified irradiation time using an electron beam drawing apparatus manufactured by Hitachi, Ltd and heated on a hot plate at 100° C. for 60 seconds. The resist was developed in a 2.38 mass % tetramethylammonium hydroxide aqueous solution at 25° C. for 60 seconds, washed with water, and dried to form a 3×3 mm pattern (8).

[Patterning Performance Evaluation]

Patterning performance was evaluated using the patterns (1) to (8) obtained in Examples 1 to 8 under the conditions shown in Table 1. The results are shown in Table 1.

TABLE 1

| Example | Pattern | Unexposed part/ exposed part | Film thickness change before and after patterning |
|---|---|---|---|
| 1 | 1 | Unexposed part | <1 |
|   |   | Exposed part | +190 |
| 2 | 2 | Unexposed part | <1 |
|   |   | Exposed part | +1 |
| 3 | 3 | Unexposed part | <1 |
|   |   | Exposed part | +10 |
| 4 | 4 | Unexposed part | +1 |
|   |   | Exposed part | +15 |
| 5 | 5 | Unexposed part | +1 |
|   |   | Exposed part | +11 |
| 6 | 6 | Unexposed part | +1 |
|   |   | Exposed part | +5 |
| 7 | 7 | Unexposed part | <1 |
|   |   | Exposed part | +240 |
| 8 | 8 | Unexposed part | +1 |
|   |   | Exposed part | +15 |

Table 1 shows that the exposure areas on the under-layer films of Examples 1 to 8 are selectively patterned by the upper-layer films for patterning.

INDUSTRIAL APPLICABILITY

The pattern forming method of the present invention can be very suitably utilized without using a general photoresist for microfabrication of integrated circuit boards and the like using a lithography process in which various types of radiation, particularly EB, X-rays, and EUV are used.

The invention claimed is:

1. A pattern forming method comprising the following steps in the following order:
   (1) a step of forming and curing a under-layer film containing a radiation-sensitive acid generator which generates an acid upon exposure to radiation on a substrate;
   (2) a step of irradiating the under-layer film with radiation through a mask to cause an acid to be selectively generated in the exposed area of the under-layer film;
   (3) a step of exposing the under-layer film to a gas which does not contain a radiation-sensitive acid generator, but contains a monomer capable of polymerizing or crosslinking by the action of an acid; and
   (4) a step of forming a cured film by polymerization of the monomer or crosslinking selectively in the area corresponding to the area of the under-layer film in which the acid has been generated.

2. A pattern forming method comprising the following steps in the following order:
   (1) a step of forming and curing a under-layer film containing a radiation-sensitive acid generator which generates an acid upon exposure to radiation on a substrate;
   (2) a step of forming an upper-layer film on the under-layer film, which does not contain a radiation-sensitive acid generator, but contains a composition capable of polymerizing or crosslinking by the action of an acid, and forming a laminate from the under-layer film and the upper-layer film;
   (3) a step of irradiating the laminate with radiation through a mask to generate an acid selectively in the irradiated area of the under-layer film;
   (4) a step of forming a cured film by polymerization or crosslinking selectively in the area of the upper-layer film corresponding to the area of the under-layer film in which the acid has been generated; and
   (5) a step of removing the area of the upper-layer film corresponding to the area of the under-layer film in which the acid has not been generated.

3. The pattern forming method according to claim 1, wherein the under-layer film is an organic film containing a radiation-sensitive acid generator.

4. The pattern forming method according to claim 2, wherein the under-layer film is an organic film containing a radiation-sensitive acid generator.

5. The pattern forming method according to claim 1, wherein the under-layer film contains a polymer having a hydrolyzate or a condensate, or both, of at least one compound selected from the group consisting of compounds shown by the following formula (1) and (2),

$$R^1_a Si(OR^2)_{4-a} \quad (1)$$

wherein $R^1$ represents a hydrogen atom or a monovalent organic group, $R^2$ represents a hydrogen atom or a monovalent organic group, and a represents an integer from 0 to 2,

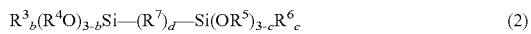
$$R^3_b (R^4 O)_{3-b} Si\text{—}(R^7)_d\text{—}Si(OR^5)_{3-c} R^6_c \quad (2)$$

wherein $R^3$, $R^4$, $R^5$, and $R^6$ the same or different, individually represent a monovalent organic group or a hydrogen atom, b and c individually represent an integer from 0 to 2, $R^7$ represents an oxygen atom or a group —$(CH_2)_n$—, (wherein n represents an integer from 1 to 6), and d represents 0 or 1.

6. The pattern forming method according to claim 2, wherein the under-layer film contains a polymer having a hydrolyzate or a condensate, or both, of at least one compound selected from the group consisting of compounds shown by the following formula (1) and (2),

$$R^1_a Si(OR^2)_{4-a} \quad (1)$$

wherein $R^1$ represents a hydrogen atom or a monovalent organic group, $R^2$ represents a hydrogen atom or a monovalent organic group, and a represents an integer from 0 to 2,

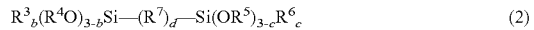
$$R^3_b (R^4 O)_{3-b} Si\text{—}(R^7)_d\text{—}Si(OR^5)_{3-c} R^6_c \quad (2)$$

wherein $R^3$, $R^4$, $R^5$, and $R^6$ the same or different, individually represent a monovalent organic group or a hydrogen atom, b and c individually represent an integer from 0 to 2, $R^7$ represents an oxygen atom or a group —$(CH_2)_n$—, (wherein n represents an integer from 1 to 6), and d represents 0 or 1.

7. The pattern forming method according to claim 2, wherein the upper-layer film contains a hydrolyzate or a condensate, or both, of a compound shown by the following formula (1),

$$R^1_a Si(OR^2)_{4-a} \quad (1)$$

wherein $R^1$ represents a hydrogen atom or a monovalent organic group, or an aryl group, $R^2$ represents a hydrogen atom or a monovalent organic group, and a represents an integer from 0 to 2.

8. The pattern forming method according to claim 2, wherein the upper-layer film contains an organic compound capable of polymerizing or crosslinking by the action of an acid, but not containing a hydrolyzate or a condensate of the compound shown by the following formula (1),

$$R^1_a Si(OR^2)_{4-a} \quad (1)$$

wherein $R^1$ represents a hydrogen atom or a monovalent organic group, or an aryl group, $R^2$ represents a hydrogen atom or a monovalent organic group, and a represents an integer from 0 to 2.

9. A pattern forming method comprising the following steps in the following order:
   (1) a step of forming and curing a under-layer film containing a radiation-sensitive acid generator which generates an acid upon exposure to radiation on a substrate;
   (2) a step of irradiating the under-layer film with radiation through a mask to cause an acid to be selectively generated in the exposed area of the under-layer film;
   (3) a step of forming an upper-layer film which does not contain a radiation-sensitive acid generator, but contains a composition capable of polymerizing or crosslinking by the action of an acid;
   (4) a step of forming a cured film by polymerization or crosslinking selectively in the area of the upper-layer film corresponding to the area of the under-layer film in which the acid has been generated; and
   (5) a step of removing the area of the upper-layer film corresponding to the area of the under-layer film in which the acid has not been generated,
   wherein the upper-layer film contains an organic compound capable of polymerizing or crosslinking by the action of an acid, but not containing a hydrolyzate or a condensate of the compound shown by the following formula (1),

$$R^1_a Si(OR^2)_{4-a} \quad (1)$$

wherein $R^1$ represents a hydrogen atom or a monovalent organic group, or an aryl group, $R^2$ represents a hydrogen atom or a monovalent organic group, and a represents an integer from 0 to 2, and wherein the upper-layer film contains a polymer having at least one repeating unit shown by the following formulas (3), (4A), and (4B) and has a polystyrene-reduced weight average molecular weight measured by a gel-permeation chromatography method of 500 to 500,000,

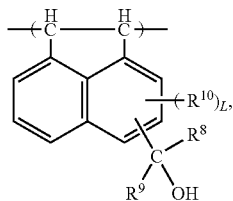
(3)

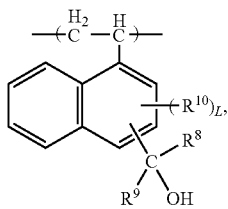
(4A)

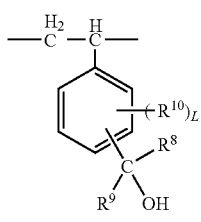
(4B)

wherein $R^8$ and $R^9$ show a hydrogen atom, an alkyl group having 1 to 3 carbon atoms, or an aryl group, $R^{10}$ represents an alkyl group having 1 to 3 carbon atoms, a vinyl group, an allyl group, or an aryl group, and L is 0, 1, or 2.

10. The pattern forming method according to claim 8, wherein the upper-layer film contains a polymer having at least one repeating unit shown by the following formulas (3), (4A), and (4B) and has a polystyrene-reduced weight average molecular weight measured by a gel-permeation chromatography method of 500 to 500,000,

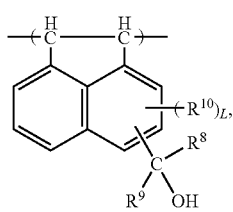
(3)

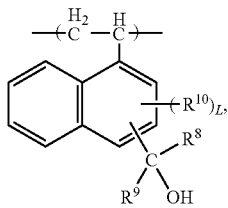
(4A)

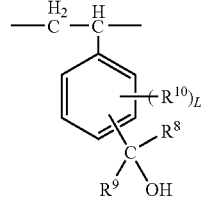
(4B)

wherein $R^8$ and $R^9$ show a hydrogen atom, an alkyl group having 1 to 3 carbon atoms, or an aryl group, $R^{10}$ represents an alkyl group having 1 to 3 carbon atoms, a vinyl group, an allyl group, or an aryl group, and L is 0, 1, or 2.

11. A pattern forming method comprising the following steps in the following order:

(1) a step of forming and curing a under-layer film containing a radiation-sensitive acid generator which generates an acid upon exposure to radiation on a substrate;
(2) a step of irradiating the under-layer film with radiation through a mask to cause an acid to be selectively generated in the exposed area of the under-layer film;
(3) a step of forming an upper-layer film which does not contain a radiation-sensitive acid generator, but contains a composition capable of polymerizing or crosslinking by the action of an acid;
(4) a step of forming a cured film by polymerization or crosslinking selectively in the area of the upper-layer film corresponding to the area of the under-layer film in which the acid has been generated; and
(5) a step of removing the area of the upper-layer film corresponding to the area of the under-layer film in which the acid has not been generated, wherein the upper-layer film contains an organic compound capable of polymerizing or crosslinking by the action of an acid, but not containing a hydrolyzate or a condensate of the compound shown by the following formula (1), $$R^1_a Si(OR^2)_{4-a} \quad (1)$$

wherein $R^1$ represents a hydrogen atom or a monovalent organic group, or an aryl group, $R^2$ represents a hydrogen atom or a monovalent organic group, and a represents an integer from 0 to 2, and wherein the upper-layer film contains a polymer having a repeating unit selected from the repeating units shown by the following formula (5) and a polystyrene-reduced weight average molecular weight measured by a gel-permeation chromatography method of 500 to 500,000,

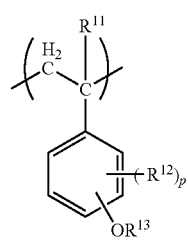
(5)

wherein $R^{11}$ and $R^{12}$ represent a hydrogen atom, an alkyl group having 1 to 3 carbon atoms, or an aryl group, $R^{13}$ represents a hydrogen atom, an alkyl group having 1 to 10 carbon atoms, a vinyl group, an allyl group, or an aryl group, and p is 0, 1, or 2.

12. The pattern forming method according to claim 8, wherein the upper-layer film contains a polymer having a repeating unit selected from the repeating units shown by the following formula (5) and a polystyrene-reduced weight average molecular weight measured by a gel-permeation chromatography method of 500 to 500,000,

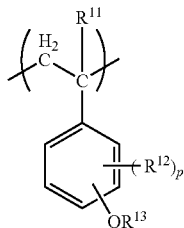

(5)

wherein $R^{11}$ and $R^{12}$ represent a hydrogen atom, an alkyl group having 1 to 3 carbon atoms, or an aryl group, $R^{13}$ represents a hydrogen atom, an alkyl group having 1 to 10 carbon atoms, a vinyl group, an allyl group, or an aryl group, and p is 0, 1, or 2.

13. A pattern forming method comprising the following steps in the following order:
    (1) a step of forming and curing a under-layer film containing a radiation-sensitive acid generator which generates an acid upon exposure to radiation on a substrate;
    (2) a step of irradiating the under-layer film with radiation through a mask to cause an acid to be selectively generated in the exposed area of the under-layer film;
    (3) a step of forming an upper-layer film which does not contain a radiation-sensitive acid generator, but contains a composition capable of polymerizing or crosslinking by the action of an acid;
    (4) a step of forming a cured film by polymerization or crosslinking selectively in the area of the upper-layer film corresponding to the area of the under-layer film in which the acid has been generated; and
    (5) a step of removing the area of the upper-layer film corresponding to the area of the under-layer film in which the acid has not been generated,
    wherein the upper-layer film contains an organic compound capable of polymerizing or crosslinking by the action of an acid, but not containing a hydrolyzate or a condensate of the compound shown by the following formula (1),

$R^1{}_a Si(OR^2)_{4-a}$ (1)

wherein $R^1$ represents a hydrogen atom or a monovalent organic group, or an aryl group, $R^2$ represents a hydrogen atom or a monovalent organic group, and a represents an integer from 0 to 2, and wherein the upper-layer film contains a polymer having a repeating unit selected from the repeating units shown by the following formula (6) and a polystyrene-reduced weight average molecular weight measured by a gel-permeation chromatography method of 500 to 500, 000,

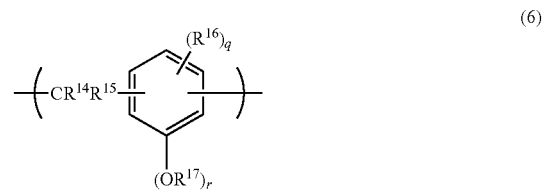

(6)

wherein $R^{14}$ and $R^{15}$ represent a hydrogen atom, an alkyl group having 1 to 3 carbon atoms, or an aryl group, $R^{16}$ represents an alkyl group having 1 to 10 carbon atoms, a vinyl group, an allyl group, or an aryl group, $R^{17}$ represents a hydrogen atom, an alkyl group having 1 to 10 carbon atoms, or an aryl group, q is 0, 1, or 2, and r is 1, 2, or 3.

14. The pattern forming method according to claim 8, wherein the upper-layer film contains a polymer having a repeating unit selected from the repeating units shown by the following formula (6) and a polystyrene-reduced weight average molecular weight measured by a gel-permeation chromatography method of 500 to 500,000,

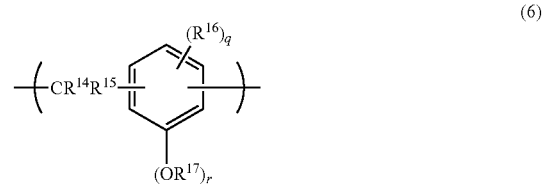

(6)

wherein $R^{14}$ and $R^{15}$ represent a hydrogen atom, an alkyl group having 1 to 3 carbon atoms, or an aryl group, $R^{16}$ represents an alkyl group having 1 to 10 carbon atoms, a vinyl group, an allyl group, or an aryl group, $R^{17}$ represents a hydrogen atom, an alkyl group having 1 to 10 carbon atoms, or an aryl group, q is 0, 1, or 2, and r is 1, 2, or 3.

15. A pattern forming method comprising the following steps in the following order:
    (1) a step of forming and curing a under-layer film containing a radiation-sensitive acid generator which generates an acid upon exposure to radiation on a substrate;
    (2) a step of irradiating the under-layer film with radiation through a mask to cause an acid to be selectively generated in the exposed area of the under-layer film;
    (3) a step of forming an upper-layer film which does not contain a radiation-sensitive acid generator, but contains a composition capable of polymerizing or crosslinking by the action of an acid;
    (4) a step of forming a cured film by polymerization or crosslinking selectively in the area of the upper-layer film corresponding to the area of the under-layer film in which the acid has been generated; and
    (5) a step of removing the area of the upper-layer film corresponding to the area of the under-layer film in which the acid has not been generated,
    wherein the upper-layer film contains an organic compound capable of polymerizing or crosslinking by the action of an acid, but not containing a hydrolyzate or a condensate of the compound shown by the following formula (1),

$R^1{}_a Si(OR^2)_{4-a}$ (1)

wherein R¹ represents a hydrogen atom or a monovalent organic group, or an aryl group, R² represents a hydrogen atom or a monovalent organic group, and a represents an integer from 0 to 2, and wherein the composition of which the molecular weight has increased as a result of polymerization of the upper-layer film contains a repeating unit selected from the repeating unit shown by the following formula (7) and has a polystyrene-reduced weight average molecular weight measured by a gel-permeation chromatography method of 500 to 500,000,

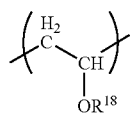
(7)

wherein $R^{18}$ represents a hydrogen atom, an alkyl group having 1 to 10 carbon atoms, or an aryl group.

16. The pattern forming method according to claim 8, wherein the composition of which the molecular weight has increased as a result of polymerization of the upper-layer film contains a repeating unit selected from the repeating unit shown by the following formula (7) and has a polystyrene-reduced weight average molecular weight measured by a gel-permeation chromatography method of 500 to 500,000,

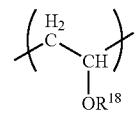
(7)

wherein $R^{18}$ represents a hydrogen atom, an alkyl group having 1 to 10 carbon atoms, or an aryl group.

17. The pattern forming method according to claim 1, wherein the composition of which the molecular weight has increased as a result of polymerization of the monomer contains a repeating unit selected from the repeating unit shown by the following formula (7) and has a polystyrene-reduced weight average molecular weight measured by a gel-permeation chromatography method of 500 to 500,000,

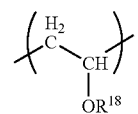
(7)

wherein $R^{18}$ represents a hydrogen atom, an alkyl group having 1 to 10 carbon atoms, or an aryl group.

\* \* \* \* \*

UNITED STATES PATENT AND TRADEMARK OFFICE
CERTIFICATE OF CORRECTION

| | | |
|---|---|---|
| PATENT NO. | : 8,119,324 B2 | Page 1 of 1 |
| APPLICATION NO. | : 12/375915 | |
| DATED | : February 21, 2012 | |
| INVENTOR(S) | : Hikaru Sugita et al. | |

It is certified that error appears in the above-identified patent and that said Letters Patent is hereby corrected as shown below:

On the Title page, the INID (87) should read as follows:

Item (87) PCT Pub. No.:   WO2008/015969
         PCT Pub. Date:  Feb. 7, 2008

Signed and Sealed this
Nineteenth Day of June, 2012

David J. Kappos
*Director of the United States Patent and Trademark Office*